US011467636B1

(12) United States Patent
Rivnay et al.

(10) Patent No.: US 11,467,636 B1
(45) Date of Patent: Oct. 11, 2022

(54) LIMITED BLAST RADIUS STORAGE SERVER SYSTEM

(71) Applicant: Amazon Technologies, Inc., Seattle, WA (US)

(72) Inventors: Roey Rivnay, Seattle, WA (US); Brendan Cully, Vancouver (CA); William Mark Megarity, Renton, WA (US); Ryan F Conroy, Seattle, WA (US); Andrew Kent Warfield, Vancouver (CA); Priti Choudhary, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 57 days.

(21) Appl. No.: 17/037,520

(22) Filed: Sep. 29, 2020

(51) Int. Cl.
*G06F 1/18* (2006.01)

(52) U.S. Cl.
CPC .................................... *G06F 1/187* (2013.01)

(58) Field of Classification Search
CPC ...... G11B 33/128; G06F 1/187; H05K 7/1492
See application file for complete search history.

(56) References Cited

U.S. PATENT DOCUMENTS

| 9,176,915 | B2* | 11/2015 | Fu ....................... G06F 13/4068 |
| 9,317,078 | B2 | 4/2016 | Lam | |
| 10,499,530 | B2 | 12/2019 | Frink et al. | |
| 2001/0049210 | A1 | 12/2001 | Pinteric | |
| 2006/0132964 | A1 | 6/2006 | Lau | |
| 2010/0118483 | A1 | 5/2010 | Kurokawa | |
| 2011/0007464 | A1 | 1/2011 | Leigh | |
| 2011/0289327 | A1 | 11/2011 | Nolterieke | |
| 2012/0116590 | A1 | 5/2012 | Florez-Larrahondo et al. | |
| 2015/0181748 | A1 | 6/2015 | Bailey et al. | |
| 2016/0095246 | A1 | 3/2016 | Noland | |
| 2016/0205804 | A1 | 7/2016 | Hartman | |

OTHER PUBLICATIONS

International Search Report and Written Opinion from PCT/US2017/020072, dated Jun. 26, 2017, Amazon Technologies, Inc., pp. 1-11.
Garth Gibson and Greg Ganger, "High-Bandwidth, Low-Latency, Scalable Storage Systems," NASD: Network Attached Secure Disks, CMU, downloaded from https://www.pdl.cmu-edu/NASD/index.shtml on Sep. 29, 2020, pp. 1-4.

(Continued)

*Primary Examiner* — James Wu
(74) *Attorney, Agent, or Firm* — Alexander A. Knapp; Kowert, Hood, Munyon, Rankin & Goetzel, P.C.

(57) ABSTRACT

A device includes an interposer card that includes a processor, such as a system on a chip (SoC), and memory devices. The interposer card mounts to a mass storage device and has a shape that corresponds to a size of an end of the mass storage device to which the interposer card is mounted. The SoC of the interposer card is configured to implement an individual server for the mass storage device to which the interposer card is mounted. In some embodiments, a data storage system includes multiple mass storage devices mounted in a chassis and coupled to one or more backplanes, wherein interposer cards are connected between the mass storage devices and the one or more backplanes.

14 Claims, 19 Drawing Sheets

(56) References Cited

OTHER PUBLICATIONS

B. Halevy, et al., "Object-Based Parallel NFS (pNFS) Operations," Internet Engineering Task Force (IETF), Jan. 2010, RFC 5664, pp. 1-36.
Erik Riedel, "Active Disks—Remote Execution for Network-Attached Storage," Nov. 1999, School of Computer Science, Carnegie Mellon University, pp. 1-180.
"T10 Working Drafts," downloaded from https://www.t10.org/drafts.htm#OSD_Family on Sep. 29, 2020, pp. 1-20.
U.S. Appl. No. 14/217,149, filed Mar. 17, 2014, David Edward Bryan.
U.S. Appl. No. 14/217,124, filed Mar. 17, 2014, David Edward Bryan.
U.S. Appl. No. 14/217,121, filed Mar. 17, 2014, David Edward Bryan.
U.S. Appl. No. 15/087,746, filed Mar. 31, 2016, Roey Rivnay, et al.

* cited by examiner

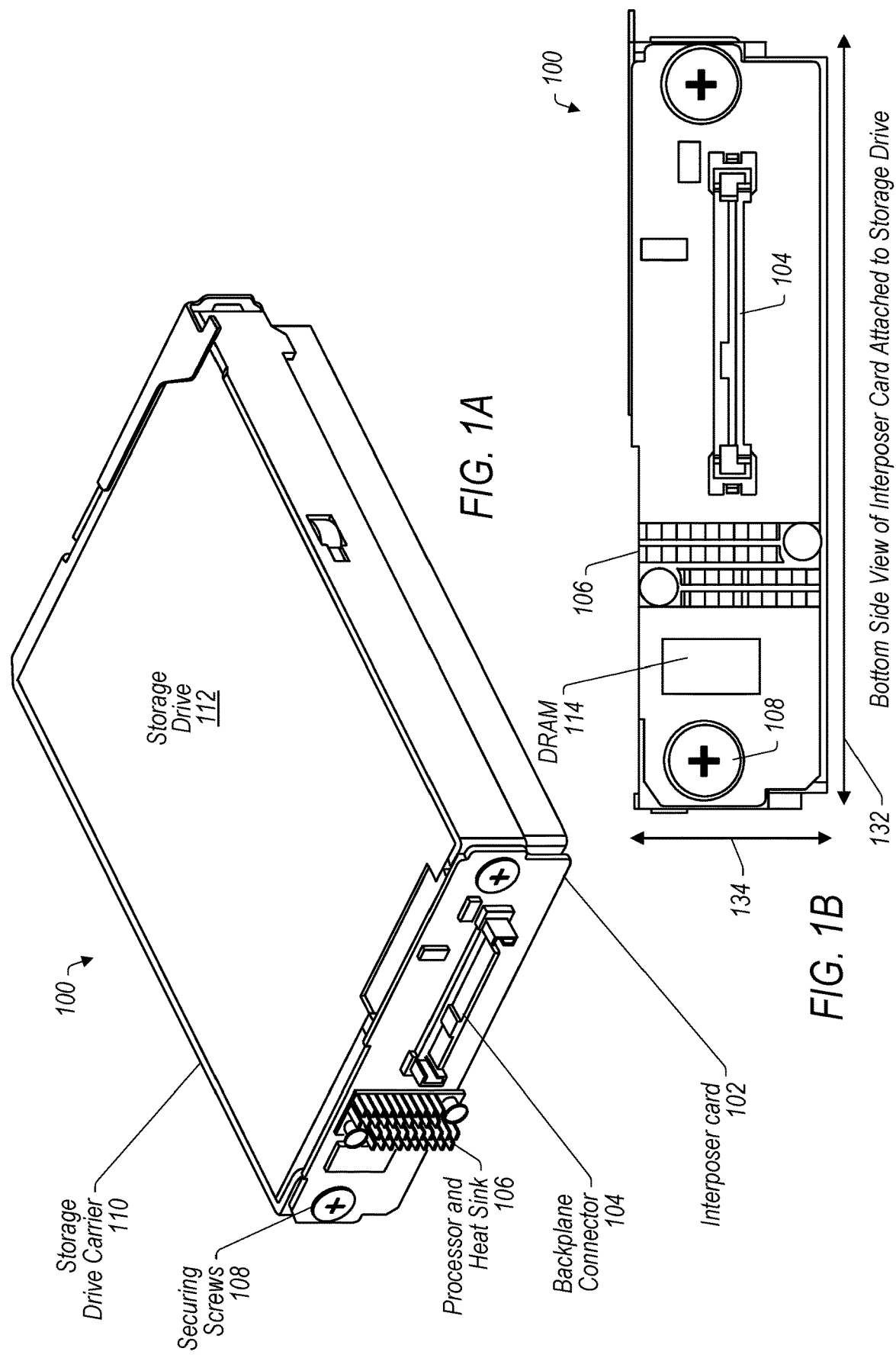

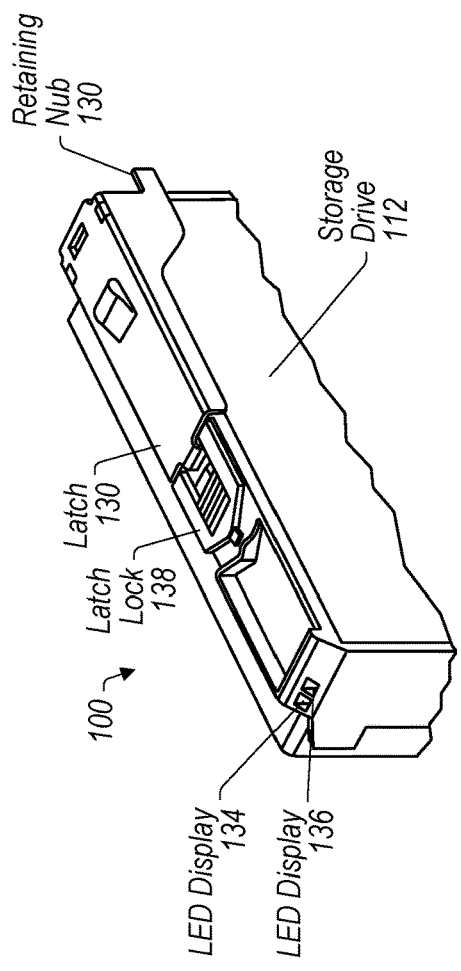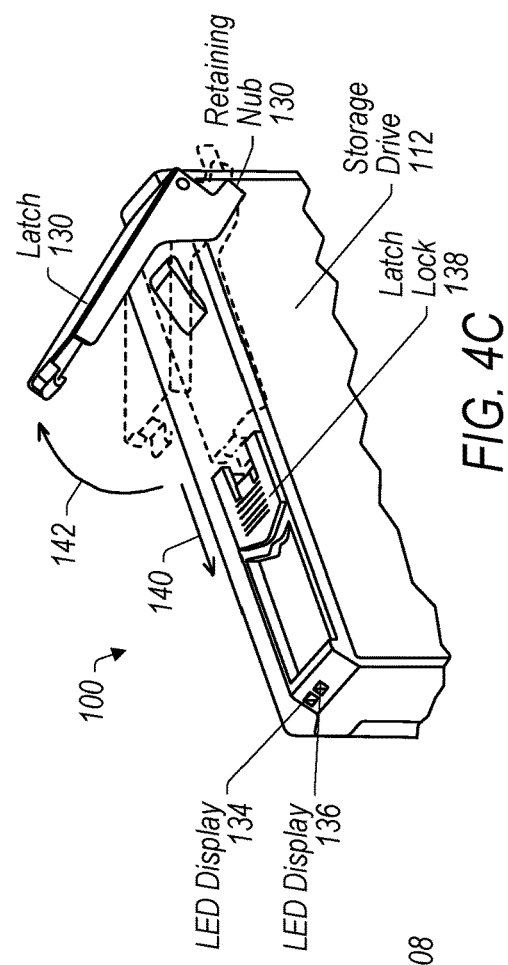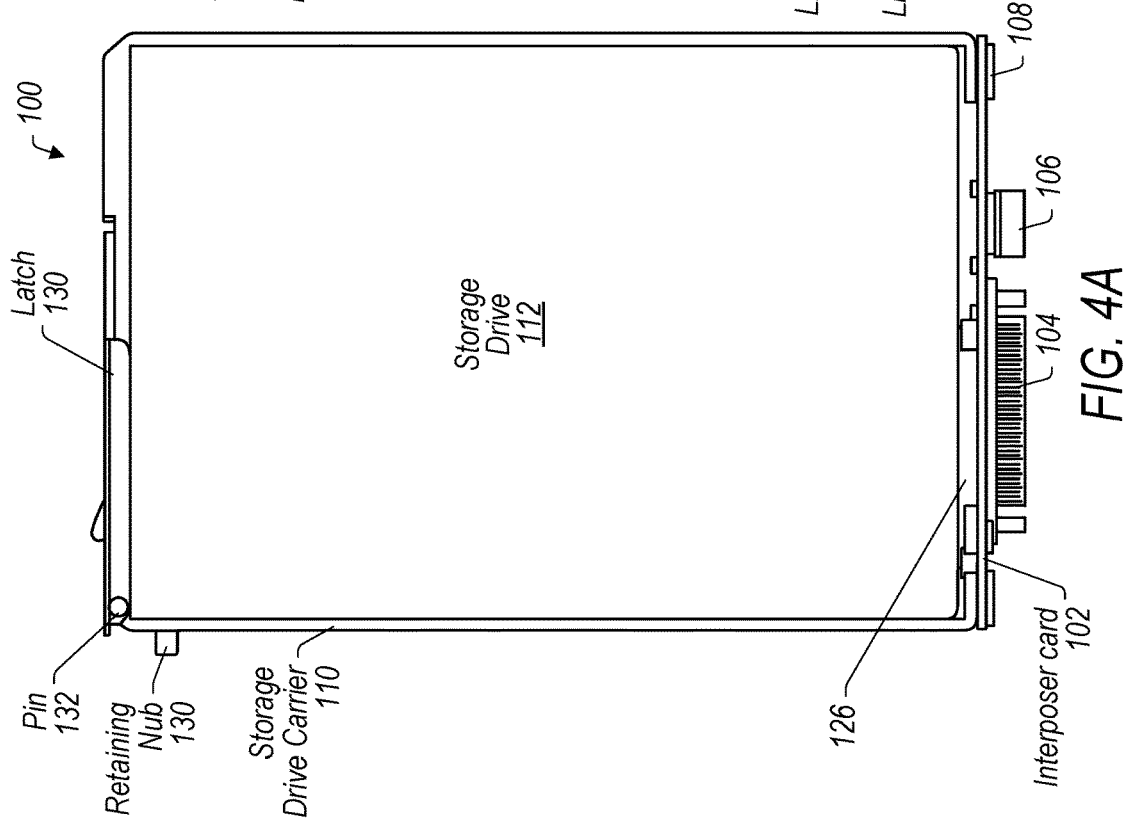

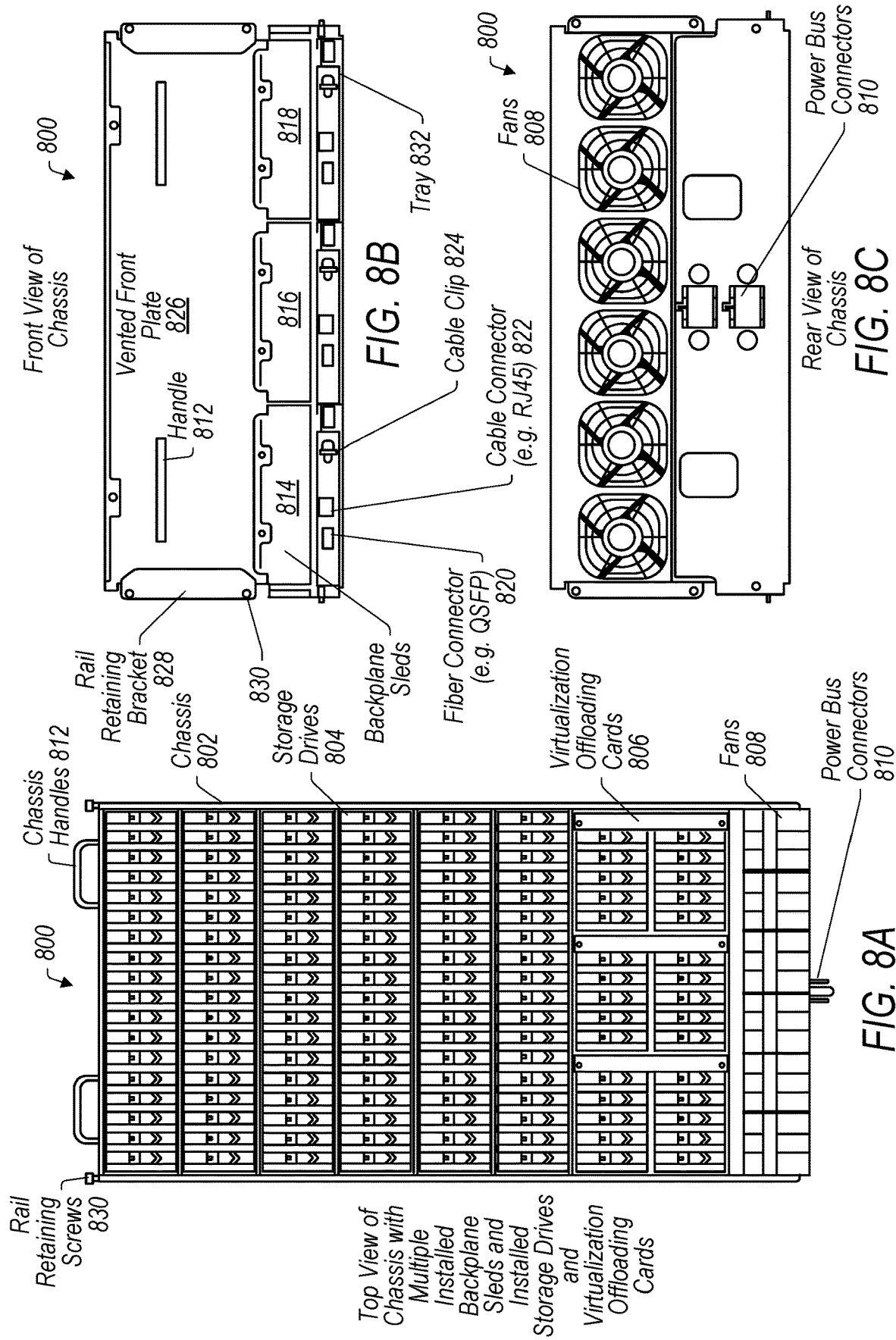

LIMITED BLAST RADIUS STORAGE SERVER SYSTEM

BACKGROUND

Computer systems typically include a number of components, including printed circuit boards, mass storage devices, power supplies, and processors. Some known computer systems are configured into rack-mountable components and are positioned within a rack system. Some known rack systems include 40 such rack-mounted components. Moreover, some known data centers include a plurality of such rack systems.

Some computer systems include a number of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in a server chassis. This wasted space, especially when multiplied over many servers in a rack, may result in inadequate computing or storage capacity for a system.

Also, some servers that include a number of hard disk drives use a centralized controller to control accesses to the hard disk drives, such as reads and writes. In such server designs using a centralized controller, a failure of the controller or ancillary equipment associated with the controller, may cause all the hard disk drives of the server to be unreachable, thus reducing the reliability of the server.

BRIEF DESCRIPTION OF THE DRAWINGS

FIG. 1A is a perspective view illustrating a storage drive mounted in a storage drive carrier and coupled with an interposer card that implements an individualized server for the storage drive, according to some embodiments.

FIG. 1B is a bottom side view of the interposer card mounted to the storage drive carrier, according to some embodiments.

FIG. 4A is a side view illustrating a storage drive mounted in a storage drive carrier and coupled with an interposer card, according to some embodiments.

FIGS. 4B-4C are perspective views of a top portion of a storage drive carrier illustrating operation of a latch mechanism and LED displays of the storage drive carrier, according to some embodiments.

FIG. 8A is a top view of a data storage system chassis comprising multiple sleds of mass storage devices attached to separate sled backplanes, according to some embodiments.

FIG. 8B is a front view of a data storage system chassis comprising multiple sleds of mass storage devices attached to separate sled backplanes, according to some embodiments.

FIG. 8C is a rear view of a data storage system chassis comprising multiple sleds of mass storage devices attached to separate sled backplanes, according to some embodiments.

Figure 1C:
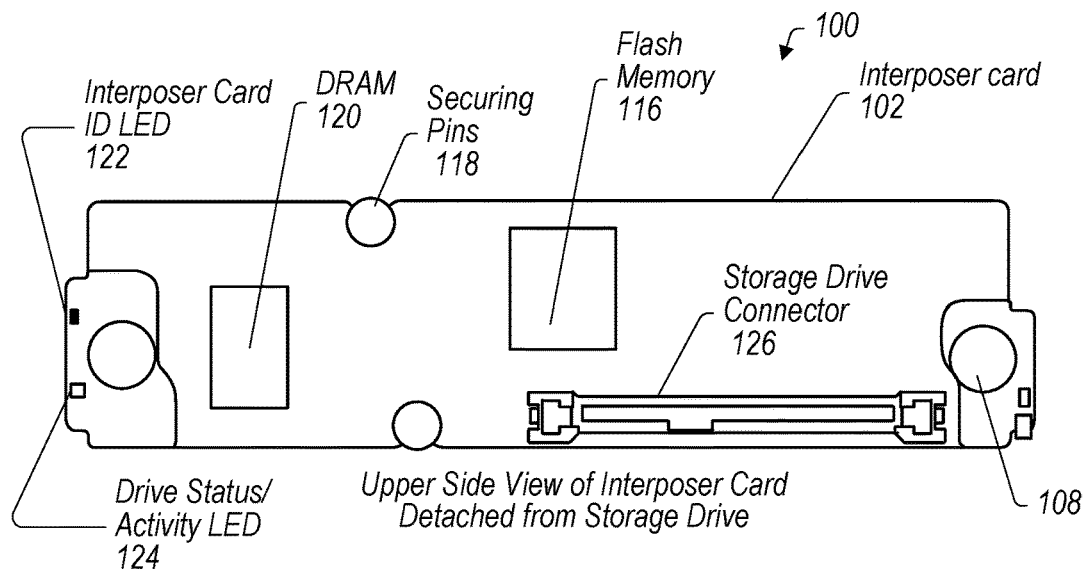
FIG. 1C is a top side view of the interposer card (that has been removed from the storage drive carrier), according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations and data storage operations, are disclosed. According to some embodiments, a data storage system includes a chassis, sleds mounted in the chassis, respective backplanes mounted in respective ones of the sleds, and mass storage devices mounted in the chassis. Also, the data storage system includes interposer cards mounted between respective ones of the mass storage devices and the respective backplanes of the respective sleds. For example, in some embodiments, each sled may comprise front and rear backplanes, wherein the backplanes comprise connectors. The interposer cards in turn may include a backplane connector configured to couple with one of the connectors of the backplanes and the interposer cards may also include another connector configured to couple with a mass storage device upon which the interposer card is mounted. In some embodiments, the backplane connector and the storage drive connector of the interposer cards may be located on opposing faces of the interposer card. Also, the interposer card may include a processor and memory configured to implement an individual server for the mass storage device connected to the interposer card. Also, the backplanes may be configured to provide network connections between a network external to the chassis of the data storage system, such as to a rack-level network switch for a rack the chassis is mounted in, and the interposer cards mounted between the respective mass storage devices and the connectors of the backplane.

According to some embodiments, a device includes an interposer card configured to be mounted to an individual mass storage device. The interposer card includes a connector located on a first side of the interposer card, wherein the connector is configured to couple with a corresponding connector of the individual mass storage device upon which the interposer card is configured to mount and a connector located on a second side of the interposer card, wherein the connector is configured to couple the interposer card to a corresponding connector of a backplane. The interposer card also includes a processor and a memory storing program instructions, that when executed by the processor, cause the processor to implement an individual server for accessing or storing data on the individual mass storage device upon which the interposer card is mounted.

According to some embodiments, a device includes a backplane configured to mount in a sled of a data storage system and configured to couple with interposer cards coupled to mass storage devices of the data storage system. The backplane includes a network connector configured to couple, via one or more cables, with a network external to the sled, connectors configured to couple with connectors of the interposer cards, a network switching circuit, and network connections configured to connect the network connector to the network switching circuit and to connect the network switching circuit to the connectors configured to couple with the connectors of the interposer cards. The backplane is configured to provide Ethernet network connectivity to the interposer cards.

As used herein, "backplane" means a plate or board to which other electronic components, such as interposer cards and mass storage devices, etc. can be mounted. In some embodiments, mass storage devices, which can include one or more hard disk drives, are plugged into a backplane, via an interposer card, in a generally perpendicular orientation relative to the face of the backplane. In some embodiments, a virtualization offloading card is plugged into a backplane in a generally perpendicular orientation relative to the face of the backplane. In some embodiments, a backplane includes one or more power buses that can transmit power to components on the backplane, and one or more data buses that can transmit data to and from components installed on the backplane. Also, in some embodiments a backplane may include an application specific integrated circuit (ASIC) configured to provide Ethernet switching for components mounted on the backplane.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, a "rack" means a rack, container, frame, or other element or combination of elements that can contain or physically support one or more computer systems. In some embodiments a rack is a standard 19" rack that conforms to EIA standards.

Some servers that mount in a rack may be general purpose servers, while some rack-mounted servers may be specially designed for storage capacity. Such specially designed servers may include storage servers that include several hard disk drives and controller servers that include controllers that manage storage operations directed at the hard disk drives in the storage servers. A controller server may be mounted in a separate chassis in a separate rack slot from a rack slot in which a storage server is mounted. In such servers, some available space in the slot of the rack in which the controller server is mounted may go unutilized, thus reducing the number and density of hard disk drives that can be mounted in the rack. For example, only a portion of a space of a rack slot in which a controller server is mounted may be occupied by components of the controller server or only a portion of an interior space within a chassis of a controller server may be occupied by components of the controller server. Also, some servers that include a separate controller server may be configured such that the controller server and hard disk drives controlled by the controller server form a single logical node. In such servers, if a common component fails, such as a component in the controller server, the whole logical node including all of the hard disk drives controlled by the controller server may become inaccessible. Thus in such designs a large number of hard disk drives may be rendered unavailable due to a single component failure.

Also, in such servers replacing a single (or multiple) hard disk drives may require removing the server including the server controller from the rack such that not only is the failed hard disk drive removed from operation, but all other hard disk drives controlled by the controller of the server are removed from operation while the failed hard disk drive is replaced.

In some embodiments, wasted space in a separate controller server may be eliminated by including interposer cards that implement individual servers for respective ones of the mass storage devices in a same chassis of a data storage system along with the mass storage devices, such as hard disk drives, that are controlled by the individual servers implemented via the interposer cards Also, failure impact due to a single component failure may be reduced by including a separate logical node for each mass storage device, each with its own server implemented via a respective interposer card, in the same chassis of the data storage system. In some embodiments, a data storage system may include interposer cards mounted in a same chassis with mass storage devices, such as hard disk drives. The interposer cards may occupy a volume of space in the chassis between the mass storage devices and a backplane. The interposer cards may have a minimal thickness (e.g. a thickness corresponding to a thickness of circuit board with respective connectors mounted on opposing faces of the circuit board) and the interposer cards may have a shape that corresponds with a shape of a bottom end of a mass storage device upon which the interposer card is mounted. For example, in some embodiments, interposer cards may have a width of four inches and a height of one inch with a thickness corresponding to a thickness of a circuit board. Thus a greater density of mass storage devices per rack may be achieved by eliminating unutilized space of a separate controller server as described above. Also, in some embodiments, multiple logical nodes each comprising its own server device (e.g. interposer card) and mass storage device controlled by the server device may be included in a chassis of a data storage system. The multiple logical nodes may be independent of each other, so that if a component in one logical node fails, such as an interposer card of the logical node, the other logical nodes in the data storage system may not be affected by the failure and continue to be available to perform storage operations.

A chassis of a data storage system may be a single enclosure that is configured to mount in a rack. Also multiple sleds with their own separate backplanes maybe mounted in a chassis of a data storage system. In some embodiments, a height of a data storage system may span multiple 1 Us in a standard 19" EAI rack. For example, a data storage system may have a height of 5 U in some embodiments.

Figure 1D:
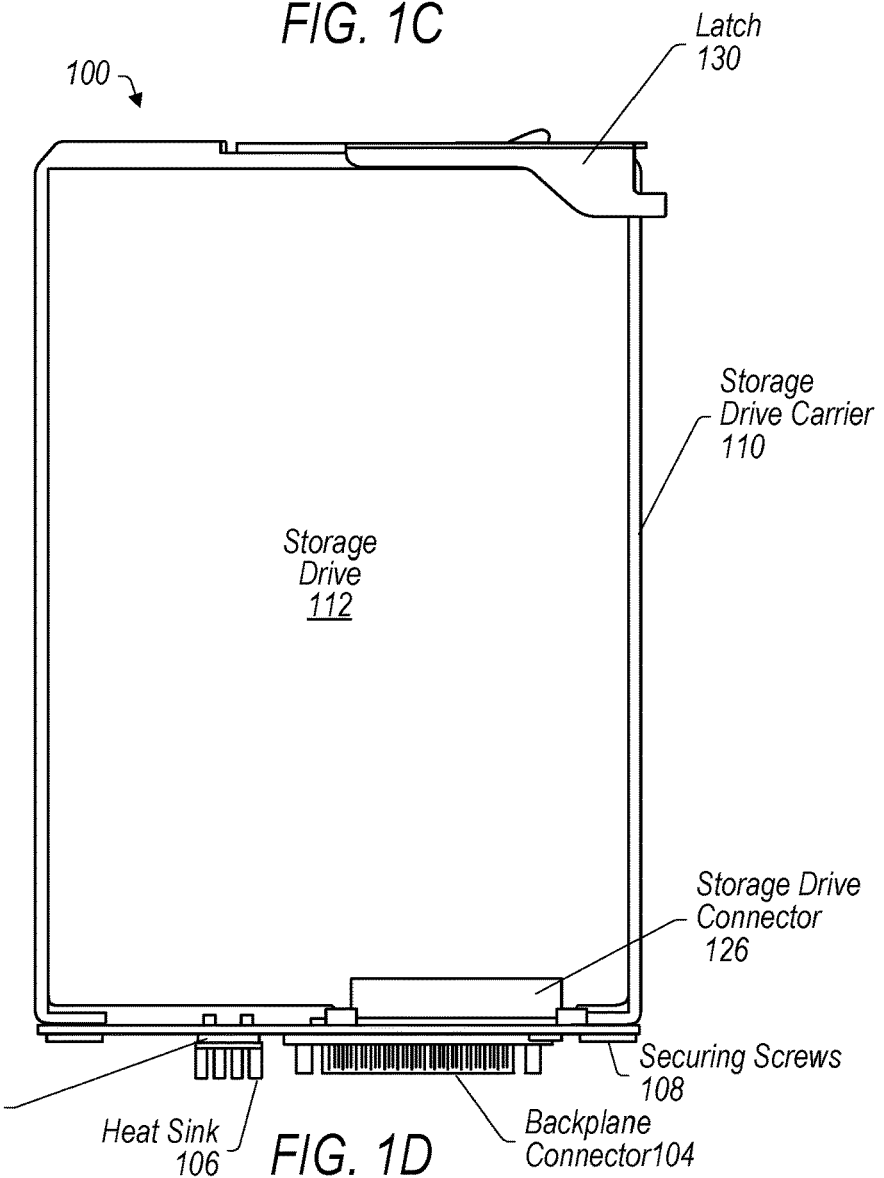
FIG. 1D is a side view illustrating the storage drive mounted in the storage drive carrier and coupled with the interposer card, according to some embodiments.

FIG. 1A is a perspective view illustrating a storage drive mounted in a storage drive carrier and coupled with an interposer card that implements an individualized server for the storage drive, according to some embodiments. FIG. 1B is a bottom side view of the interposer card mounted to the storage drive carrier, according to some embodiments. FIG. 1C is a top side view of the interposer card (that has been removed from the storage drive carrier), according to some embodiments. FIG. 1D is a side view illustrating the storage drive mounted in the storage drive carrier and coupled with the interposer card, according to some embodiments.

In some embodiments, an interposer card is mounted to a mass storage device. In some embodiments the interposer card may be mounted directly to a frame of the mass storage device or may be mounted to a storage drive carrier in which the mass storage device is mounted. In some embodiments, an interposer card may include a processor that implements a system on a chip (SoC) along with dynamic random access memory (DRAM) and flash memory. The SoC and attached DRAM and flash memory may be configured to implement an individual server for the mass storage device to which the interposer card is attached. As discussed in more detail in regard to FIG. 6, in some embodiments the implementation of the individual sever at the SoC of the interposer card may be part of a hybrid system, wherein the SoC operates as a server endpoint, but some functionality traditionally performed by a server is performed by components mounted on a backplane to which the interposer card (that includes the SoC) is mounted. For example, a baseboard management controller (BMC), security chip, and virtualization offloading card coupled to a backplane may support multiple interposer card SoC's. For example, instead of each interposer card including fan controls, firmware update software, debugging software, etc. some of these and other functions may be performed by shared components coupled to a backplane to which the interposer cards are also coupled.

In some embodiments, a data storage system 100 includes a storage drive 112 mounted in storage drive carrier 110, wherein an interposer card 102 is secured to the storage drive carrier 110 via securing screws 108. The interposer card 102 may include a storage drive connector (such as storage drive connector 126 shown in FIG. 1C) that is coupled with a connector of storage drive 112 (not visible in FIG. 1A). In some embodiments the connection between the interposer card 102 and the storage drive 112, via storage drive connector 126, may be a serial advanced technology attachment (SATA) connection, a PCIe connection, or a SCSI connection. Also, interposer card 102 includes a backplane connector 104 configured to couple with a corresponding connector of a backplane. In some embodiments the connection between the interposer card 102 and the backplane of the data storage system may be an Ethernet type connection. Also, interposer card 102 includes a processor and heat sink 106. In some embodiments, the processor may be a 1 Gigahertz 64-bit ARM based SoC. Though in some embodiments, other types of processors may be used. Additionally, interposer card 102 include DRAM 114 and flash memory 116 (shown in FIG. 1C). Also interposer card 102 may include an additional DRAM module, such as DRAM 120 shown in FIG. 1C. Securing pins 118 may secure the heat sink 106 to the interposer card. The processor and heat sink 106 may be mounted on a face of the interposer card 102 that faces towards a backplane when the interposer card is installed in a chassis. In this way the heat sink may be positioned in an air passage between the backplane and the interposer card, such that airflow through the air passage removes heat from the heat sink and cools the processor, such as SoC 128 as shown in FIG. 1D.

In some embodiments, an interposer card, such as interposer card 102, may include one or more LED indicator lights. For example, interposer card 102 includes interposer card ID LED light 122 and drive status/activity LED light 124. In some embodiments, interposer card ID LED 122 may be illuminated when interposer card 102 is in a failed state in order to allow the failed interposer card to be quickly identified. Also, in some embodiments, a control signal, such as during testing may cause interposer card ID LED 122 to be illuminated. In some embodiments, drive status/activity LED 124 may be used to communicate status and activity information about the mass storage device to which interposer card 102 is coupled, such as information about storage drive 112.

In some embodiments, backplane connector 104 and storage drive connector 126 may be located on opposing faces of the interposer card 102. For example, storage drive connector 126 may be located on a first face of the interposer card 102 that faces storage drive 112 when the interposer card is installed and backplane connector 105 may be located on a second face of the interposer card 102 that faces the backplane when the interposer card is installed.

In some embodiments, a data storage system that utilizes interposer cards as described herein may reduce total cost of ownership of a data storage system by avoiding wasted space in the chassis. For example as is the case in other system that devote a rack slot to server devices, wherein the rack slot devoted to server devices does not add data storage capacity to the system. Also, because each interposer card implements an independent individual server for each mass storage device, a failure of a single interposer card only affects a single mass storage device. Thus, it is not necessary to take data access offline for other mass storage devices in response to a failure of an individual interposer card. Likewise, if a mass storage device fails, the failed mass-storage device can be replaced without taking offline other mass storage devices, each with their own attached independent server implemented via an attached interposer card. Also, because only the single mass storage device is affected, replication of data between mass storage devices in anticipation of performing a maintenance activity may be limited. This is because, unlike other system where maintenance affects a blast radius of multiple mass storage devices, a single mass storage device and/or interposer card may be exchanged without upsetting other mass storage devices and attached interposer cards mounted in a same chassis with the failed mass storage device.

In some embodiments, interposer card 102 may have a length 132 that is approximately a same length as a bottom face of the storage drive 112 and/or the storage drive carrier 110. In some embodiments, interposer card 102 may have a width 134 that is approximately a same width as a width of the bottom face of the storage drive 112. In some embodiments, an interposer card 102 may have a first dimension of approximately four inches long and a second dimension of approximately one inch wide. In some embodiments, a thickness of an interposer card 102 may be a thickness of printed circuit board plus an amount to which backplane connector 104 and storage drive connector 126 extend out from the interposer card 102. Also, in some embodiments, heat sink 106 may extend out from interposer card a similar or slightly greater amount than backplane connector 104 extend out from the second face of the interposer card 102.

Figure 2:
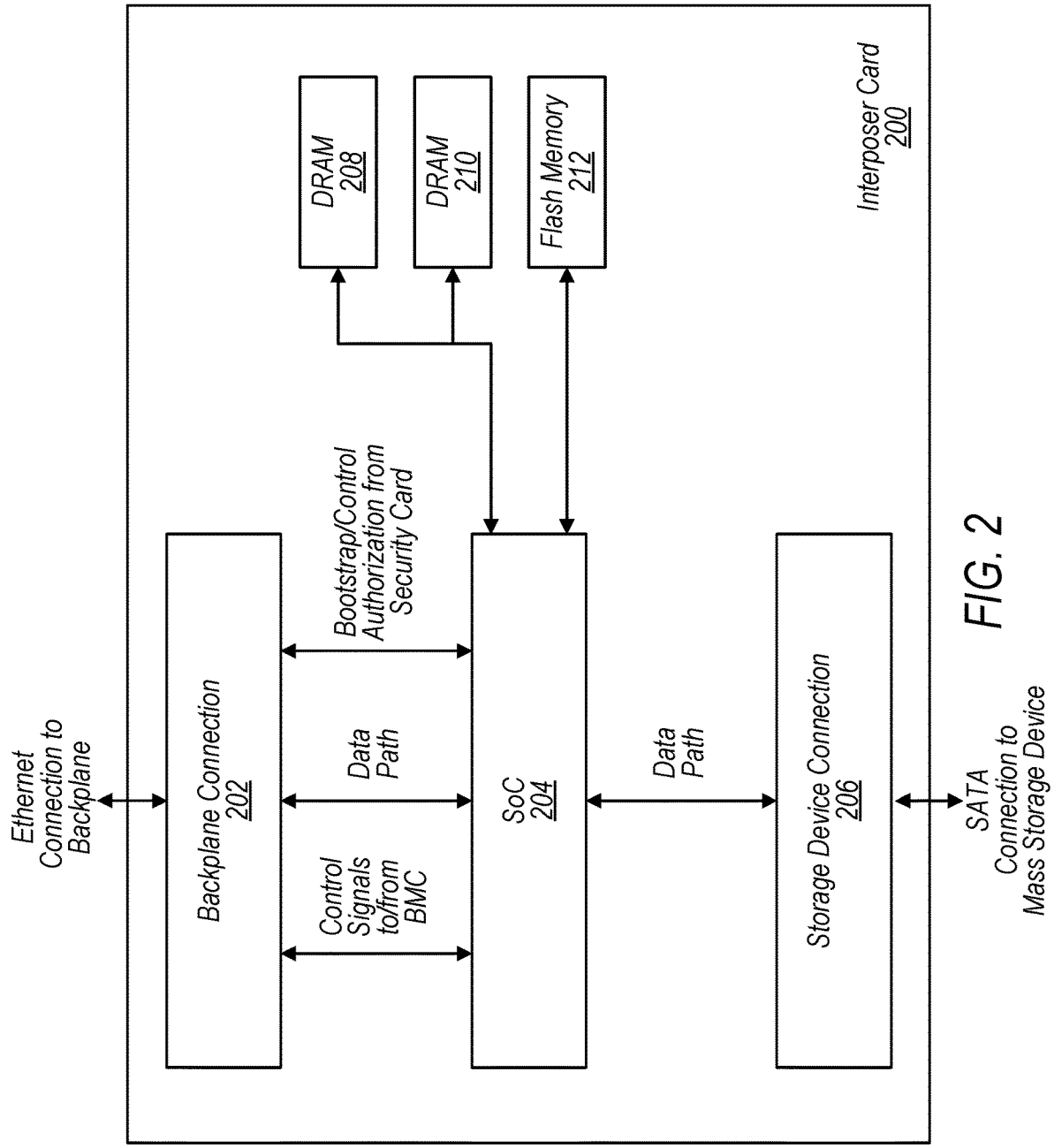
FIG. 2 is a block diagram illustrating components of an interposer card, according to some embodiments.

FIG. 2 is a block diagram illustrating components of an interposer card, according to some embodiments.

As explained above, a backplane connector 104 may establish a connection to a backplane connection 202 between a SoC of an interposer card, such as SoC 204 of interposer card 200 and an Ethernet network of the backplane. Also, a storage device connector 126 may establish a storage device connection 206, which may be a SATA connection between SoC 204 of interposer card 200 and an attached mass storage device, such as storage drive 112. Also DRAM modules 208 and 210 may be connected to SoC 204 along with flash memory 212. In some embodiments, SoC 204 may communicate with components of the backplane to which the interposer card 200 is attached via backplane connection 202, such as a BMC of the backplane, a security chip of the backplane, and an ASIC Ethernet switch of the backplane. In some embodiments, different combinations of memory modules may be used in an interposer card. For example, while interposer card 200 includes two DRAM modules 208 and 210 and a single flash memory module 212, in some embodiments more or fewer DRAM modules may be used. Also more flash memory modules may be included in an interposer card. In some embodiments, different ones of the memory modules, such as DRAM modules 208 and 210 and/or flash memory module 212 may be positioned on different ones of the faces of the interposer card.

In some embodiments, metadata for data objects stored in attached storage drive 112 may be cached in flash memory 112. For example, in embodiments wherein storage drive 112 stores data shards, shard mapping metadata may be stored in flash memory 212.

Figure 3:
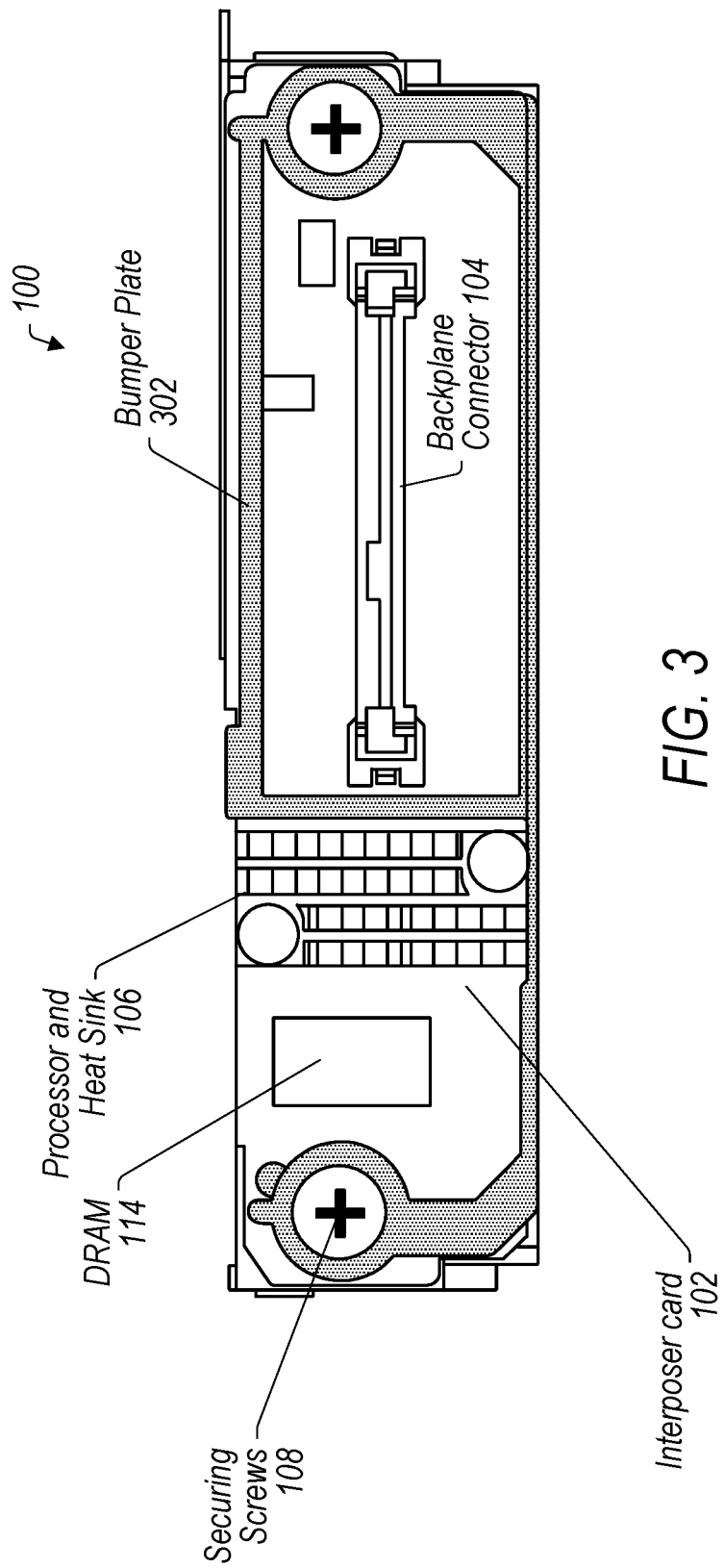
FIG. 3 is a bottom side view of the interposer card mounted to the storage drive carrier, wherein a bumper plate layer is mounted with the interposer card, according to some embodiments.

FIG. 3 is a bottom side view of the interposer card mounted to the storage drive carrier, wherein a bumper plate layer is mounted with the interposer card, according to some embodiments.

In some embodiments, a bumper plate layer 302 may be attached to interposer card 102 and/or may be a layer into which interposer card 102 fits. The bumper plate layer 302 may extend beyond a perimeter of the interposer card 102 and may protect the interposer card 102 from being damaged when being installed in a chassis/being coupled and de-coupled from a backplane. For example, instead of a corner of the interposer card 102 bumping against the chassis, the bumper plate layer 102 may bump into the chassis and protect the interposer card 102. In some embodiments, the bumper plate layer 302 may be a layer that is fixed between the interposer card 102 and the storage drive carrier 110 when the interposer card is 102 is secured to the storage drive carrier 110 via securing screws 108.

FIG. 4A is a side view illustrating a storage drive mounted in a storage drive carrier and coupled with an interposer card, according to some embodiments.

In some embodiments, storage drive carrier 110 includes a latch 130 that is fixed to the storage drive carrier via pin 132 and that includes retaining nub 130. When the latch 130 is in a closed position, retaining nub 130 engages in a slot of a retaining wall of a chassis to secure the storage drive 112 in the chassis and to secure backplane connector 104 in place in a corresponding connector of a backplane upon which the storage drive 112 and interposer card 102 are mounted.

FIGS. 4B-4C are perspective views of a top portion of a storage drive carrier illustrating operation of a latch mechanism and LED displays of the storage drive carrier, according to some embodiments.

In some embodiments, a storage drive carrier 110 may also include a latch lock 138 to secure the latch 130 in a closed position when installed in a chassis. As shown in FIG. 4C, the latch lock 138 may be slid forward (140) to release the latch 130. Also, the latch 130 may be pulled upward (142) to cause retaining nub 130 to disengage from a retaining wall of a chassis. Thus, allowing storage drive carrier 110 that encloses storage drive 112 and to which interposer card 102 is mounted, to be removed from the chassis. In some embodiments, the storage drive carrier 110, the storage drive 112, and the interposer card 102 may be installed and removed from the chassis as a unit.

In some embodiments, storage drive carrier 110 may include light pipes running along a side of the storage drive carrier 110. The light pipes may transmit light signals from LED indicators 122 and 124 (as shown in FIG. 1C) to LED displays 134 and 136 of the storage drive carrier 110. In some embodiments, LED displays 134 and 135 may be viewable when looking down into a chassis that has been pulled out of a rack (and if including a chassis cover, having the chassis cover removed).

Figure 5:
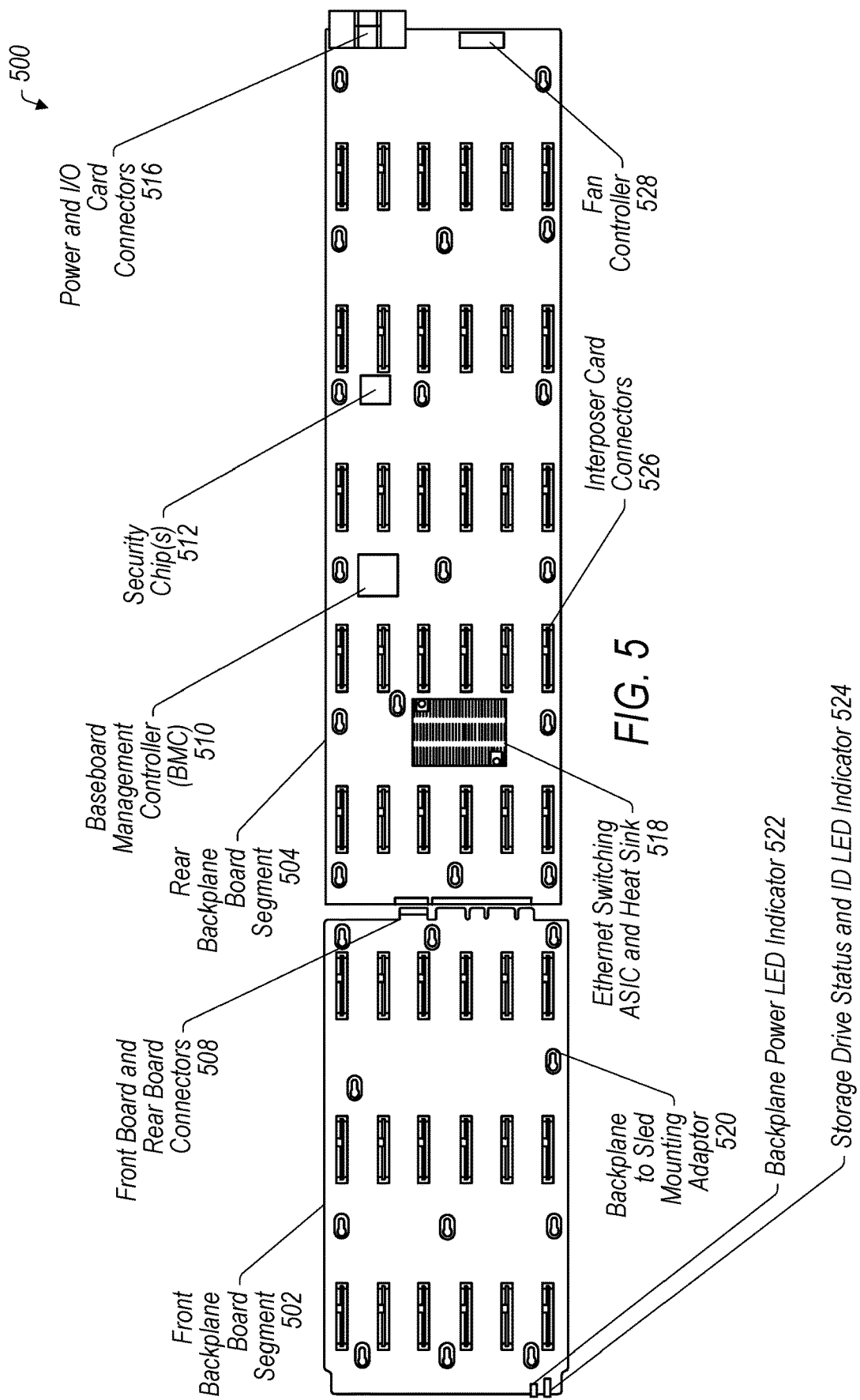
FIG. 5 is a top view of attached backplane portions (e.g. front and rear backplanes) that are configured to couple with backplane connectors of interposer cards, according to some embodiments.

FIG. 5 is a top view of attached backplane portions (e.g. front and rear backplanes) that are configured to couple with backplane connectors of interposer cards, according to some embodiments.

In some embodiments, a backplane or multiple connected backplanes are mounted in a backplane sled that is configured to slide into and out of a chassis of a data storage system. The backplanes include rows and columns of connectors configured to couple with backplane connectors of interposer cards, such as backplane connector 104. In some embodiments, backplanes mounted in a sled may include 8 rows and 6 columns of connectors configured to accept 48 mass storage devices coupled with interposer cards. In some embodiments, at least some of the connectors of the backplane may be configured to couple with an interposer card coupled to a virtualization offloading card. In some embodiments, the backplanes include one or more application specific integrated circuits (ASICs) that provide Ethernet switching to route traffic to server devices implemented at the respective SoCs of the interposer cards coupled to the backplane.

In some embodiments, the backplane further comprises a baseboard management controller (BMC) for remotely controlling the servers implemented via the SoCs of the interposer cards. Also, the BMC may be used to control functions of a virtualization offloading card, wherein the virtualization offloading card manages virtualization operations for compute instances to be launched on the SoCs of the interposer cards.

Note that as used herein a virtualization offloading card refers to a component that manages networking and routing of traffic from servers implemented on SoCs of interposer cards as compute instances of a computing service. While in some embodiments, multiple compute instances may be implemented on a single SoC, in other embodiments, each SoC may be a bare-metal instance, such that the virtualization offloading card manages networking and routing for the bare metal instance but does not necessarily implement virtual machines on the bare metal instance.

The baseboard management controller (BMC), may, in conjunction with the virtualization offloading card, enable remote control of the servers implemented using the SoCs of the interposer cards. For example, the BMC may emulate a monitor, a keyboard, a mouse, etc. In some circumstances, the SoCs may be designed to only allow some operations, such as software updates or firmware updates, to be initiated via connected user interface devices, in which case, a BMC may emulate such user interface devices to allow for the operations (e.g. software updates and/or firmware updates) to be performed remotely without a user actually interacting with the interposer cards directly.

In some embodiments, a virtual computing service may remotely operate a server implemented using a SoC of an interposer card via a virtualization offloading card and/or a BMC. In some embodiments, a BMC may include a remote virtualization offloading controller that is in communication with a virtualization offloading card coupled to the backplane with the BMC. In some embodiments, the virtualization offloading card may include a root of trust component and may permit or prohibit actions from being taken by the BMC based on whether or not a root of trust can be verified. In some embodiments the root of trust component may be included in a security chip coupled to the backplane.

In some embodiments, a virtualization offloading card may include various elements of hardware (e.g., including processors/cores, memories, storage devices, circuitry for power management, security management and the like) and software that collectively implement network and storage virtualization management, provide access to storage, and incorporate the compute instances instantiated on the SoCs of the interposer cards within isolated virtual networks (IVNs) or other logical networks set up for a client at the virtualized computing service or cloud computing service.

In some embodiments, the security chips may permit or inhibit system communications between the BMC and system control components, such as thermal sensors, fans, power distribution components, etc. For example, if the virtualization offloading card cannot verify a trusted relationship with a system control component, the virtualization offloading card may cause the security chips to inhibit communication flow between the system control component and the BMC. Additionally, security chips may inhibit or permit commands from the BMC directed to system control components, such as a power source for the virtualization offloading card, a power source for interposer cards, a power source for the flash memory of the interposer cards, etc.

In some embodiments, the security chips may be implemented on a single physical chip, such as a single complex programmable logic device (CPLD) or field programmable gate array (FPGA), or other suitable hardware component.

In some embodiments, compute instances instantiated on the SoCs of the interposer cards may be managed by a data storage service that utilizes the mass storage devices with attached interposer cards as storage resources of the data storage service. In such cases, the compute instances implanted on the SoCs of the interposer cards may be included in an isolated virtual network of the compute service that is managed by the data storage service. In other embodiments, the compute instances instantiated on the SoCs of the interposer cards may be allocated to clients of the computing service and managed by the clients as compute instances attached to mass storage devices. In some embodiments, the compute instances may be "bare-metal" instances in that each compute instance corresponds to a different SoC, such that there is not a virtualization layer implemented wherein multiple clients share a common SoC. Though in other embodiments, virtualization at the SoC level may be implemented.

For example, backplane system 500 may be mounted in a sled and includes front backplane board segment 502 that is coupled with rear backplane segment board 504 via front and rear board connectors 508. Both front backplane board 502 and rear backplane board 504 include backplane to sled mounting adaptors 520 configured to couple the backplane boards to a base of a sled. Also, as described above front backplane board 502 and rear backplane board 504 include interposer card connectors 526 which may be organized into 8 rows and 6 columns for a total of 48 connectors. In some embodiments, 3 rows of connectors may be included on front backplane board segment 502 and 5 rows of connectors may be included on rear backplane board segment 504. Though, in some embodiments, other arrangements of connectors may be used.

In some embodiments, front backplane board segment 502 may include LED indicators at a front of the board that faces a front face of the chassis. For example, front backplane board segment 502 includes backplane power LED indicator 522 and storage drive statue and ID LED indicator 524.

In some embodiments, rear backplane board 504 includes BMC 510, security chips 512, Ethernet switching ASIC(s) 518 and associated heat sinks. Also in some embodiments, power and I/O card connectors 516 may couple with rear backplane board segment 504. Also, in some embodiments, a fan controller 528 and/or fans may mount on rear backplane board segment 504.

Figure 6:
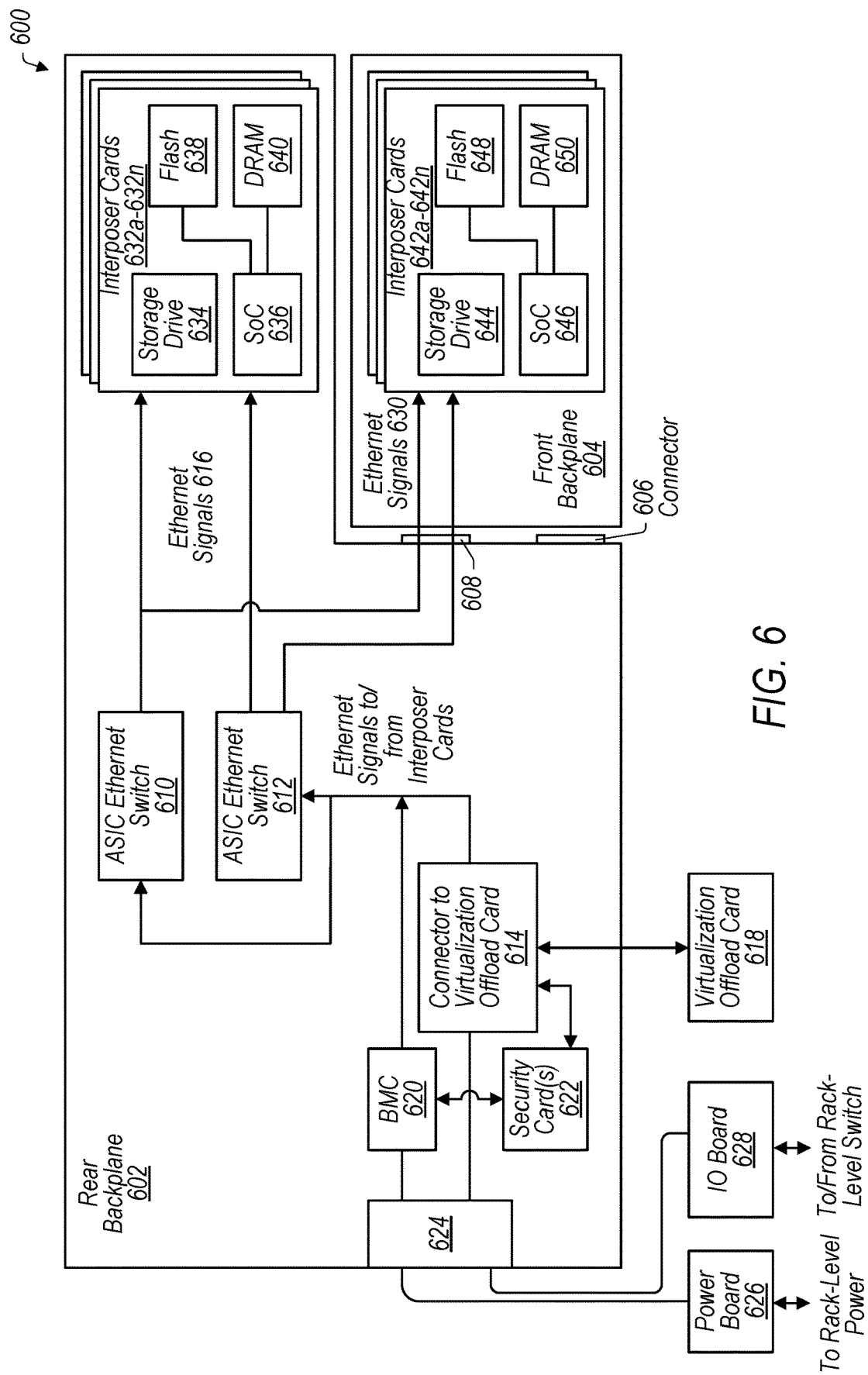
FIG. 6 is a block diagram of a data storage system illustrating functional components of front and rear backplanes and attached interposer cards and data storage drives, according to some embodiments.

FIG. 6 is a block diagram of a data storage system illustrating functional components of front and rear backplanes and attached interposer cards and data storage drives, according to some embodiments.

Data storage system 600 includes rear backplane 602 coupled to front backplane 604 via connectors 606 and 608. Note that the shapes of front backplane 602 and rear backplane 604 are shown for ease of illustration, but may have different shapes such as those shown in FIG. 5.

In some embodiments, a backplane system may include redundant Ethernet Switching ASICs. In this way a failed Ethernet Switching ASIC may not result in a loss of use of the mass storage devices and interposer cards coupled to the backplane system. For example, rear backplane 602 includes ASIC Ethernet switches 610 and 612. In some embodiments, ASIC Ethernet switches 610 and 612 may be hot-swappable, wherein a failed ASIC Ethernet switch can be removed while a non-failed ASIC Ethernet switch continues to route traffic to mass storage devices attached to the backplane via interposer cards. As discussed in more detail in regard to FIGS. 9A-9B a chassis of a data storage system may be slid out of a rack while the mass storage devices and attached interposer cards remain in service.

Rear backplane 602 also includes a connector 614 to couple the rear backplane 602 to virtualization offload card 618. Additionally, rear backplane 602 includes BMC 620 and security chip(s) 622. Also, connector 624 couples rear backplane 602 to power board 626 and I/O board 628. Note that Ethernet signals 616 from I/O board 628 may be routed to interposer cards 632a-632n via ASIC Ethernet switches 610 and 612. Also, Ethernet signals 630 may be routed from I/O board 628 to interposer cards 642a-642n mounted on front backplane 604.

In some embodiments, I/O board 628 may be coupled to a 25 Gigabyte Ethernet connection at a rack-level for a rack in which the chassis of the data storage system is mounted, such as a top of rack (TOR) switch. In some embodiments, ASIC Ethernet switches 610 and/or 612 may route 2.5 Gigabyte Ethernet connections to each of the SoCs of the interposer cards, such as SoCs 636 of interposer cards 632a-632n or SoCs 646 of interposer cards 642a-642n. Also as previously discussed the respective interposer cards may include flash memory and DRAM memory and be coupled with a mass storage device. For example, interposer cards 632a-632n include flash memory 638 and DRAM memory 640, and are also coupled to mass storage devices 634. Likewise, interposer cards 642a-642n include flash memory 648 and DRAM memory 650 and are also coupled to mass storage devices 644.

In some embodiments a backplane system may function as a network aggregator that distributes network connections down to interposer cards, while also providing some hybrid server services for the interposer cards, such as reporting on sensors, performing firmware updates, performing debugging, etc. Also, the BMC 620 of the backplanes may provide telemetry control for the interposer cards, power management, and event and control functionality, etc.

Figure 7:
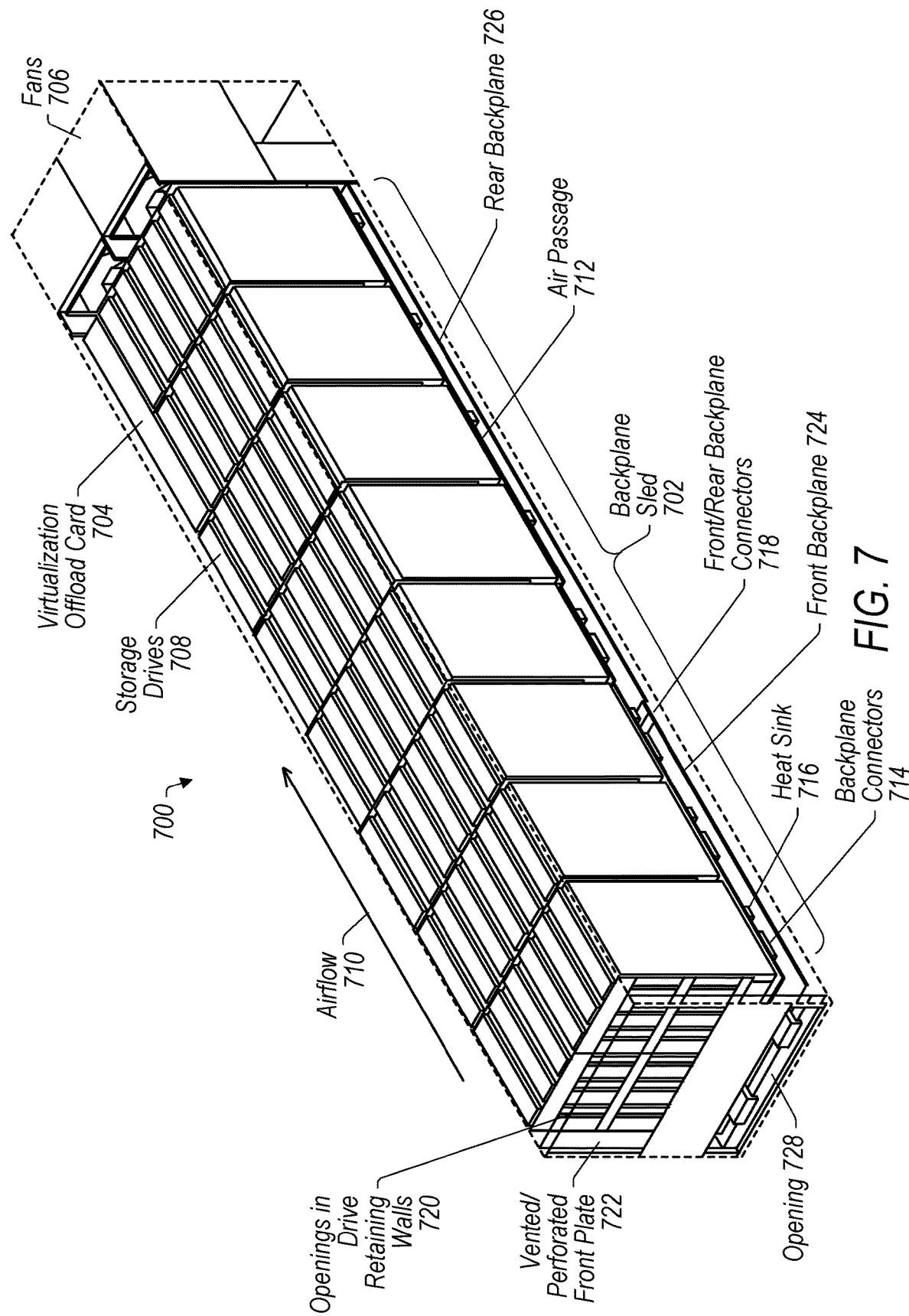
FIG. 7 is a perspective view of a sled of a data storage system comprising mass storage devices coupled via interposer cards to a set of backplanes of the sled, according to some embodiments.

FIG. 7 is a perspective view of a sled of a data storage system comprising mass storage devices coupled via interposer cards to a set of backplanes of the sled, according to some embodiments.

Sled system 700 includes backplane sled 702 includes backplanes 724 and 726 coupled together via front/rear backplane connectors 718. Mass storage devices 708 and virtualization offloading card 704 are coupled to backplanes 724 and/or 726 via respective interposer cards coupled with backplane connectors 714.

In some embodiments, the backplane connectors 714 coupled with corresponding interposer card backplane connectors (such as backplane connector 104) form an air passage 712 between the backplanes 724/726 and the interposer cards coupled to the mass storage devices 708 and virtualization offloading card 704. In some embodiments, fans 706 are mounted in a chassis with sled system 700 and pull air through the sled system 700 according to air flow direction 710 which may be from front to back of the backplane sled 702, wherein the front faces a cold aisle of a data center and the rear faces a hot aisle of a data center.

In some embodiments, a data storage system includes a vented/perforated front plate 722 (a portion of which is shown in FIG. 7) that allows air to flow into the sled system 700. Also, in some embodiments, the chassis of the data storage system includes drive retaining walls that include openings 720 that enable air to flow between the mass storage devices in direction 710. Also, front plate 722 may include an opening 728 that enables air to be drawn into air passage 712 and flow underneath the mass storage devices 704 and across heat sinks 716 of the interposer cards.

FIG. 8A is a top view of a data storage system chassis comprising multiple sleds of mass storage devices attached to separate sled backplanes, according to some embodiments. FIG. 8B is a front view of a data storage system chassis comprising multiple sleds of mass storage devices attached to separate sled backplanes, according to some embodiments. FIG. 8C is a rear view of a data storage system chassis comprising multiple sleds of mass storage devices attached to separate sled backplanes, according to some embodiments.

Data storage system 800 includes chassis 802 into which backplane sleds 814, 816, and 818 are mounted. Note that backplane sleds 814, 816, and 818 may be similar to the backplane sled 702 described in FIG. 7, wherein each backplane sled includes backplane segments as described in FIG. 5. Also mass storage devices 804 and virtualization offloading cards 806 are mounted in chassis 802. In some embodiments, a virtualization offloading card 806 is mounted in each sled.

Additionally, fans 808 and power bus connectors 810 are mounted on chassis 802. In some embodiments, chassis 802 includes handles 812 for sliding the chassis into and out of a rack on rails. In some embodiments, rails are secured to the chassis via rail retaining screws 830 that secure rail retaining bracket 828 to vented front plate 826.

In some embodiments, chassis 802 includes networking and power trays 832 mounted below sleds 814, 816, and 818. In some embodiments, networking and power trays 832 include a fiber connector 820, which may be a QSFP type connector. Also, networking and power trays 832 include cable connector 822, which may be a RJ45 type connector. Additionally, networking and power trays 832 include a cable clip 824 for securing networking cables coupled to fiber connector 820 or cable connector 822.

In some embodiments, chassis 802 includes power bus connectors 810 configured to couple with a power bus of a rack. Note in some embodiments, other types of power connectors may be used, such as plug and receptacle type power connectors. In some embodiments trays 832 may include a power cable chain that enable the sleds 814, 816, and 818 to be slid out of the chassis without disconnecting network or power to the backplanes of the sleds.

Figure 9A:
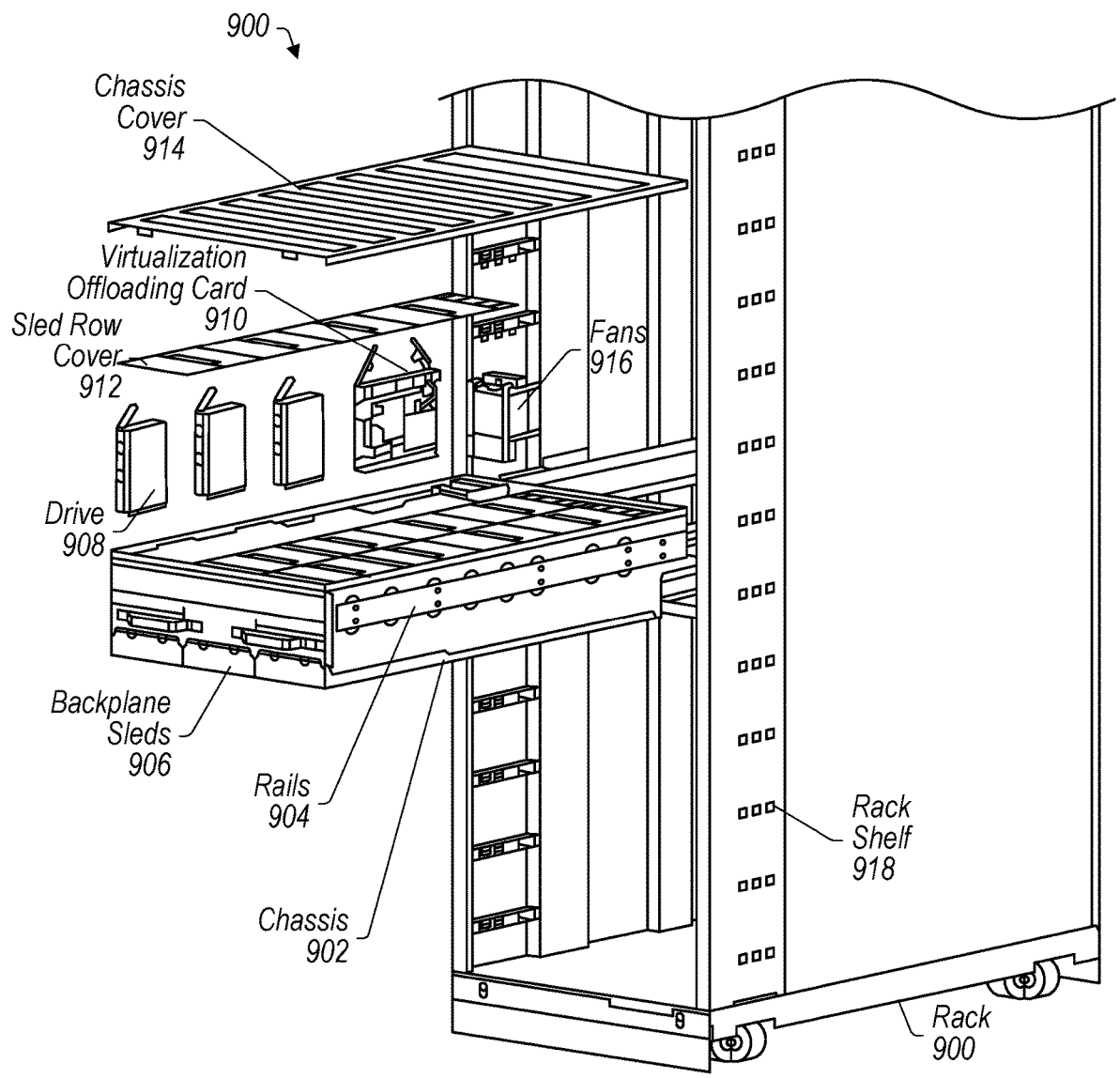
FIG. 9A is an exploded view of a data storage system that mounts in a rack, according to some embodiments.

FIG. 9A is an exploded view of a data storage system that mounts in a rack, according to some embodiments.

System 900 includes rack 900 that includes rack shelves 918. Chassis 902 of a data storage system is mounts in a rack shelf 918 of rack 900 via rails 904. Chassis 902 also includes backplane sleds 906, which may include backplanes as described herein. Mass storage devices 908 and virtualization offloading card 910 mount into slots in the chassis and couple via interposer cards to backplanes of the sleds 906. Sled row cover 912 mounts over the mass storage devices 908 and virtualization offloading card 910 mounted to a given backplane of a given backplane sled 906. Also, fans 916 mount in the chassis and chassis cover 914 mounts on a top of the chassis 902.

As can be seen in FIG. 9A, individual mass storage devices 908 with attached interposer cards can be vertically removed from the chassis 902 when the chassis is extended out of rack 900 via rails 902, and when the chassis cover 914 and sled row cover 912 are removed. Likewise, individual fans 916 and virtualization offloading cards 910 may be replaced. In such circumstances, the components may be replaced while non-failed components, such as other mass storage devices and attached interposer cards remain in service.

Figure 9B:
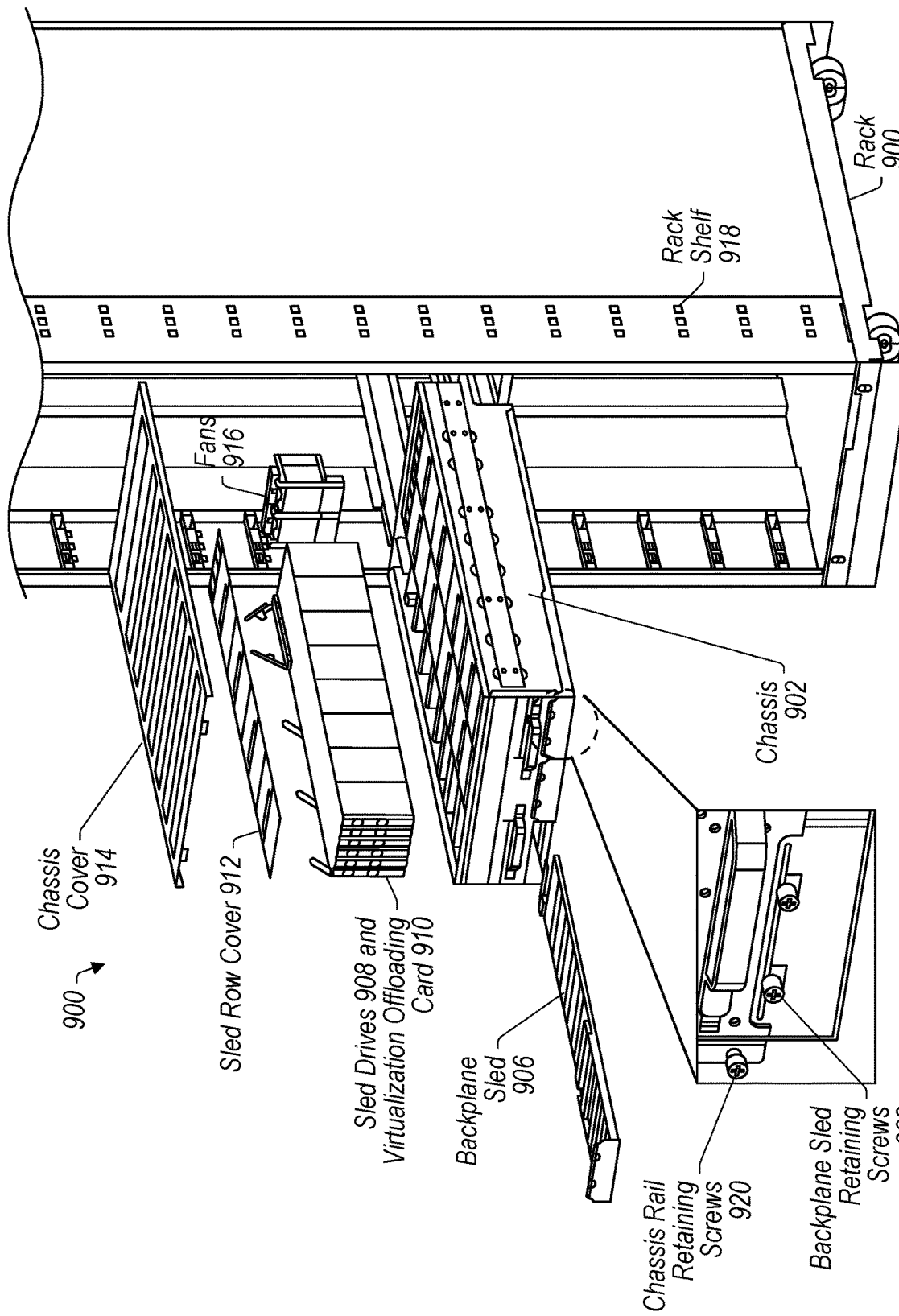
FIG. 9B is another exploded view of a data storage system that mounts in a rack, according to some embodiments.

FIG. 9B is another exploded view of a data storage system that mounts in a rack, according to some embodiments.

As can also be seen if FIG. 9B, rail retaining screws 920 may be affixed to prevent the chassis 902 from sliding out on rails 904, for example when no maintenance operations are being performed.

Additionally, as can be seen in FIG. 9B, backplane sled retaining screws 922 may be loosened/removed to enable backplane sled 906 to slide out of chassis 902. In this way a single failed backplane can be replaced while other non-failed backplanes remain in service. In some embodiments, in order to slide backplane sled 906 out of chassis 902, it may be necessary to remove the sled drives 908 and virtualization offloading card 910 coupled via interposer cards to the backplane of the backplane sled 906.

Figure 10A:
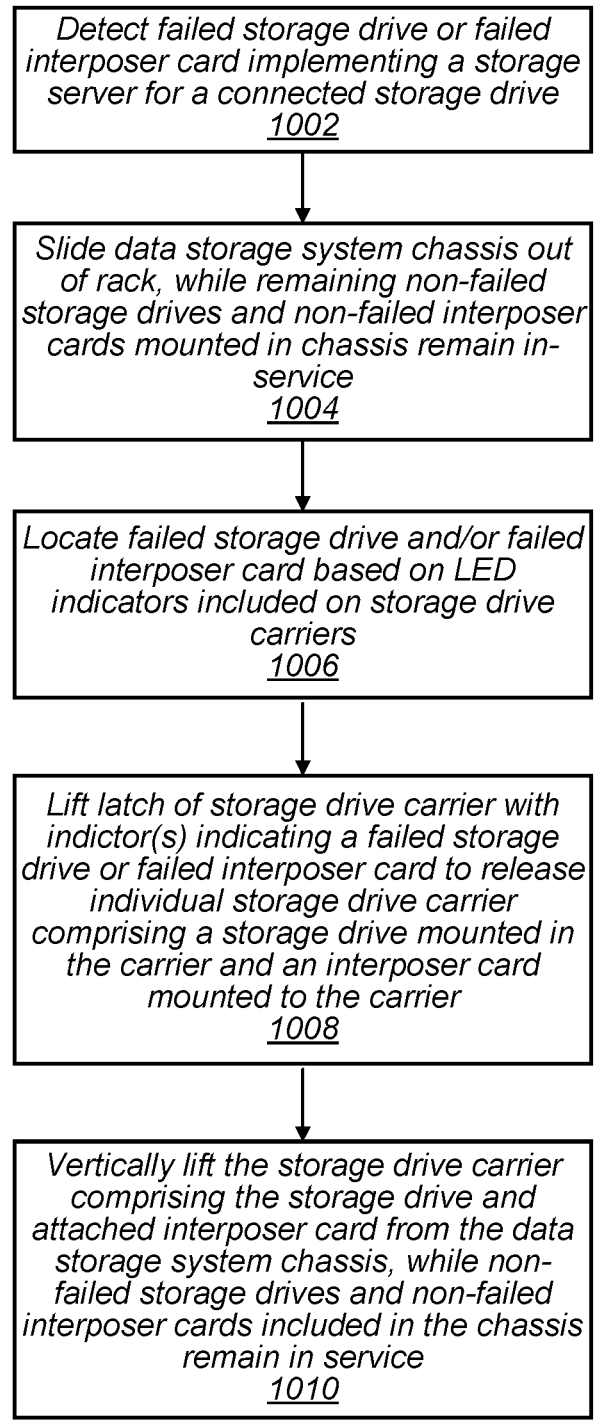
FIGS. 10A-10B are flowcharts illustrating a procedure for replacing a failed interposer card or failed storage drive without interrupting operation of other storage drives or interposer cards mounted in a chassis with the failed interposer card or the failed storage drive, according to some embodiments.
Figure 10B:
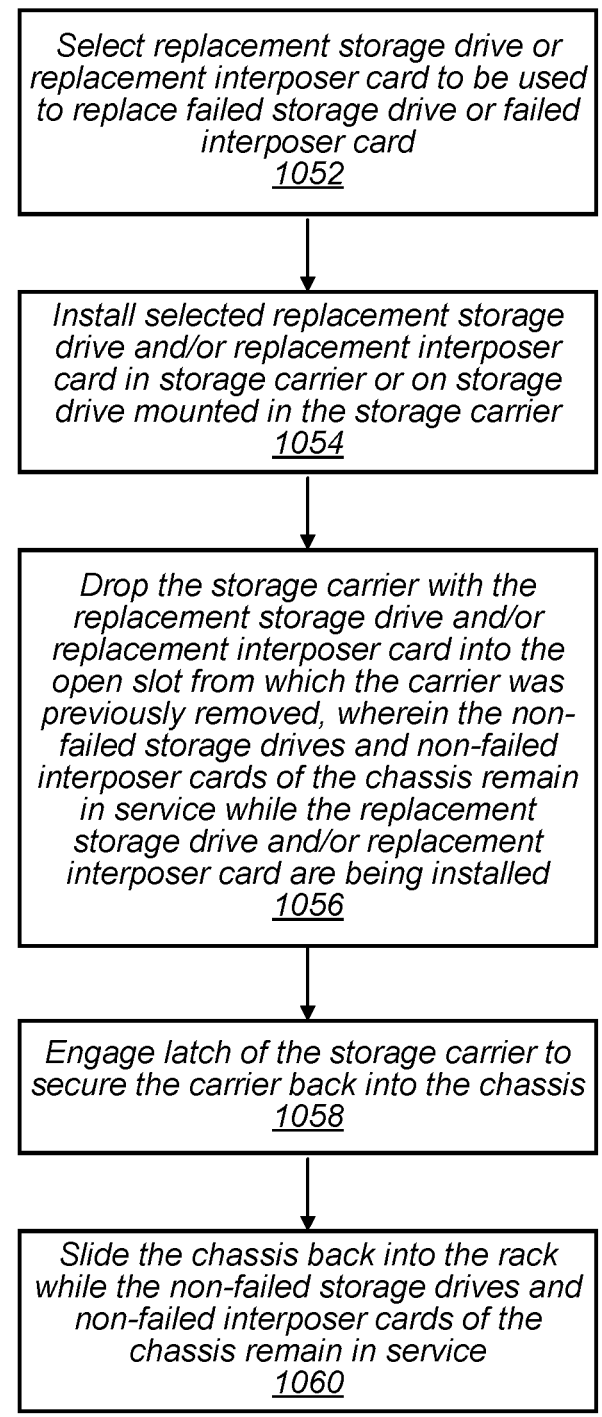

FIGS. 10A-10B are flowcharts illustrating a procedure for replacing a failed interposer card or failed storage drive without interrupting operation of other storage drives or interposer cards mounted in a chassis with the failed interposer card or the failed storage drive, according to some embodiments.

At 1002, a failed mass storage device or failed interposer card is detected in a data storage system. For example, the interposer card may be implementing a server instance for an attached mass storage device. A failure of the interposer card may cause the server to become unresponsive and/or a failure of the mass storage device may cause data storage via the server to be unavailable. In some embodiments, various monitoring systems may be used to detect a failed interposer card or a failed mass storage device.

At 1004, in response to detecting a failed interposer card or a failed mass storage device, or in response to an accumulated number of failed interposer cards and/or failed mass storage devices exceeding a threshold, a technician may be dispatched to the data storage system to replace the failed interposer card(s) and/or mass storage device(s). In order to replace the failed components, the technician may slide the chassis of the data storage system out of the rack via rails, such as 904. In some embodiments the chassis may include an upper portions comprising backplane sleds with attached interposer cards and mass storage devices that slides out of the rack, while a second portion of the chassis that includes power and networking trays 832 (as shown in FIG. 8B) remain in the rack. In some embodiments, flexible cable guides may be included in power and networking trays 832 that enable the upper portion of the chassis to be slid out of the rack while remaining connected to power and networking. Thus, non-failed interposer cards and non-failed mass storage devices may remain in service while the upper portion of the chassis is slid out of the rack on rails.

At 1006, the technician may locate the failed interposer card or the failed mass storage device in the chassis. In some embodiments, after sliding the upper portion of the chassis out of the rack, the technician may remove a chassis cover (e.g. chassis cover 914) and/or a sled row cover (e.g. sled row cover 912) in order to be able to view the tops of the storage drive carriers mounted in the chassis. Also, as discussed in regard to FIG. 4B, the storage carriers may include light pipes and LED displays 134 and 136 that enable the technician to read the status indicated by LEDs 122 and 124 of the interposer card. For example light emitted from LEDs 122 and 124 of an interposer card 102 (as shown in FIGS. 1A-1D) may be transmitted to the tops of the storage drive carriers and viewable from above when the chassis cover and/or sled cover is removed.

Once a failed mass storage device and/or failed interposer card is identified, at 1008, the technician may lift a latch of the storage drive carrier, such as latch 130, in order to release an individual storage drive carrier from a retaining wall of the chassis while other mass storage devices with attached interposer cards remain connected and in-service.

At 1010, an individual storage drive carrier comprising a failed mass storage device, or to which a failed interposer card is attached, may be vertically lifted out of the chassis while the remaining storage drive carriers with non-failed mass storage devices and non-failed interposer cards remain connected and in-service.

At 1052, a replacement mass storage device or replacement interposer card may be selected to replace the failed mass storage device or the failed interposer card. In some embodiments, a best available replacement component may be selected as opposed to being restricted to replacing a failed component with a similar replacement part. For example, a failed mass storage device may be replaced with a newer mass storage device version that may provide greater storage capacity. Also, in some embodiments, a failed interposer card may be replaced with an upgraded interposer card version. Additionally, in situations wherein an upgraded mass storage device requires an upgraded interposer card, the interposer card may be proactively replaced to satisfy the requirements of the upgraded mass storage device.

At 1054, the selected replacement part may be installed in the storage drive carrier (e.g. if replacing a mass storage device) or may be coupled to the storage drive carrier (e.g. if replacing an interposer card), or both.

At 1056, the storage drive carrier that includes the replacement part(s) may be dropped/inserted into the open slot created when the storage drive carrier was removed at 1010. The storage drive carrier may be installed while the chassis is in the extended position, extended out of the rack and while remaining mass storage devices and interposer cards associated with other storage drive carriers remain connected to power and network and are in-service.

At 1058, the latch of the storage drive carrier may be closed to engage a retaining nub (e.g. retaining nub 130) in a retaining wall of the chassis. In some embodiments, the retaining nub may secure the storage drive carrier in the chassis and ensure that the backplane connector of the interposer card stays connected to a corresponding connector of the backplane.

At 1060, the sled row cover and/or chassis cover may be re-installed if removed and the chassis may be slid back into the rack. During the process of changing the failed component in steps 1002 through 1060 non-failed mass storage devices and interposer cards mounted in the chassis with the failed mass storage device and/or failed interposer card may remain connected to power and network and remain in service. While in service during steps 1002 through 1060 the non-failed components may continue to process data storage requests and data access requests on behalf of clients of the data storage system.

Figure 11A:
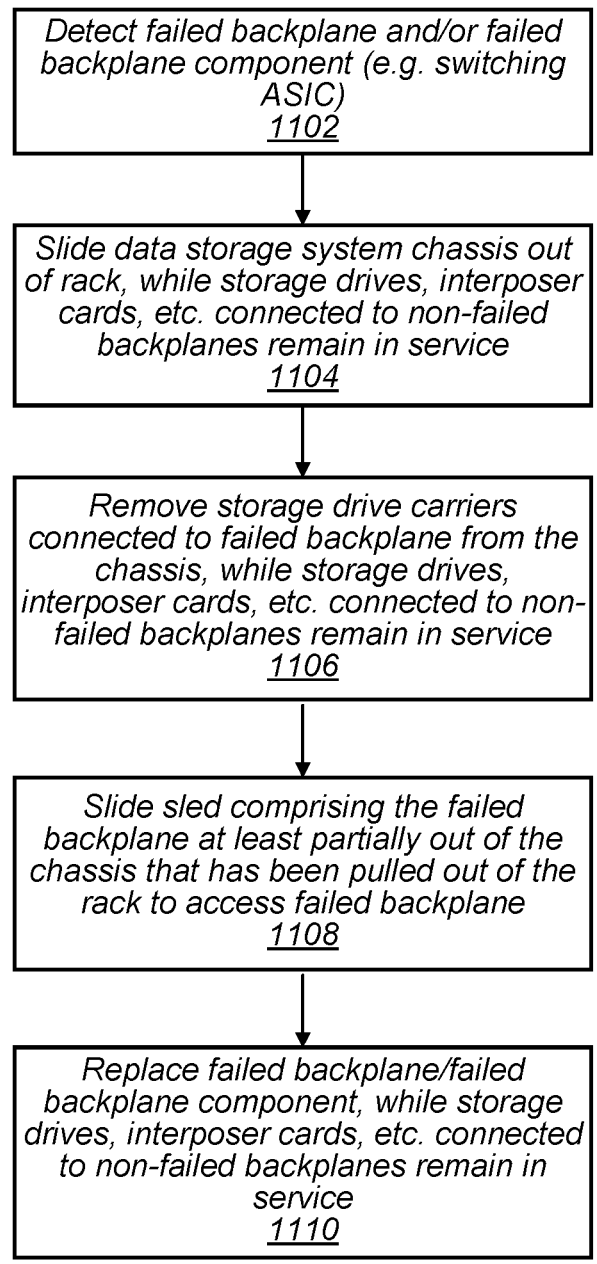
FIGS. 11A-11B are flowcharts illustrating a procedure for replacing a failed backplane or backplane component without interrupting operation of other storage drives or interposer cards mounted on other backplanes in a chassis with the failed backplane or backplane component, according to some embodiments.
Figure 11B:
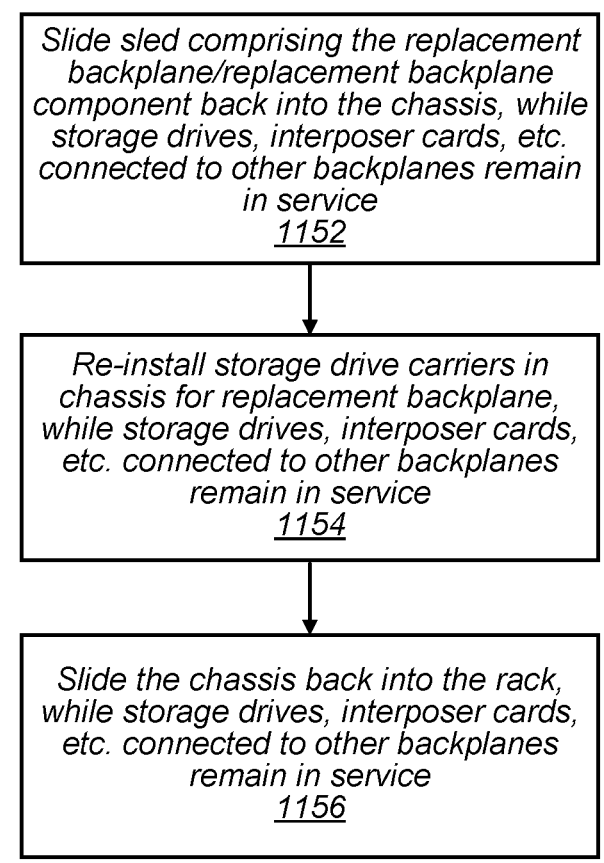

FIGS. 11A-11B are flowcharts illustrating a procedure for replacing a failed backplane or backplane component without interrupting operation of other storage drives or interposer cards mounted on other backplanes in a chassis with the failed backplane or backplane component, according to some embodiments.

At 1102, a failed backplane and/or failed backplane component such as a failed ASIC Ethernet switch is detected. Note in some embodiments, a backplane may include LED indicators 522 and 524 (as shown in FIG. 5) to identify which backplane in a chassis has failed or includes a failed component. Also, in some embodiments, the backplane LED indicators may indicate whether a backplane is coupled with a failed mass storage device and/or a failed interposer card.

At 1104, the data storage system chassis is slid out of the rack, while mass storage devices, interposer cards, etc. in the chassis remain connected to power and network and in-service (other than mass storage devices and interposer cards connected to a failed backplane that is to be replaced).

At 1106, storage drive carriers are disconnected and removed from the failed backplane, while storage drive carriers and associated mass storage devices and interposer cards connected to non-failed backplane remain in service.

At 1108, a sled housing the failed backplane is slid out of the chassis. Also, at 1110, the failed backplane is replaced in the sled with a non-failed backplane. This may be done while other backplanes in the chassis remain in service.

At 1152, the sled comprising the installed replacement backplane is slid back into the chassis. And, at 1154, the storage drive carriers with associated mass storage devices and interposer cards are connected to the replacement backplane (and are secured in the chassis via latches).

At 1156, the chassis is slid back into the rack. Note that the non-failed backplanes and attached mass storage devices and interposer cards remain in service while the failed backplane is replaced.

Figure 12:
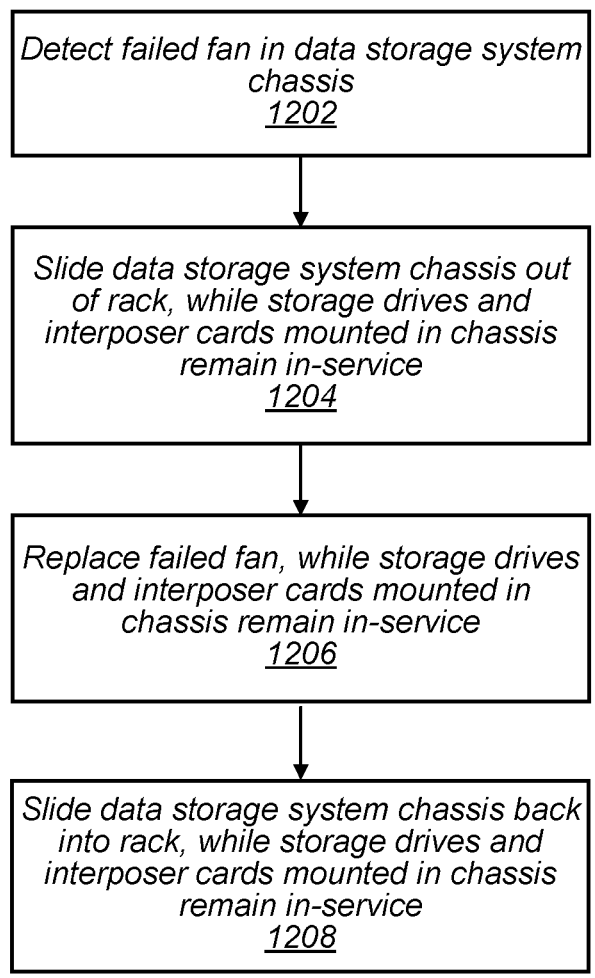
FIG. 12 is a flowchart illustrating a procedure for replacing a failed fan without interrupting operation of storage drives or interposer cards mounted in a chassis with the failed fan, according to some embodiments.

FIG. 12 is a flowchart illustrating a procedure for replacing a failed fan without interrupting operation of storage drives or interposer cards mounted in a chassis with the failed fan, according to some embodiments.

At 1202, a failed fain is detected in the data storage system chassis.

At 1204, the data storage system chassis is slid out of the rack while mass storage devices and interposer cards remain connected to power and network and remain in service.

At 1206, the failed fan is replaced and at 1208, the data storage system chassis is slid back into the rack.

Figure 13:
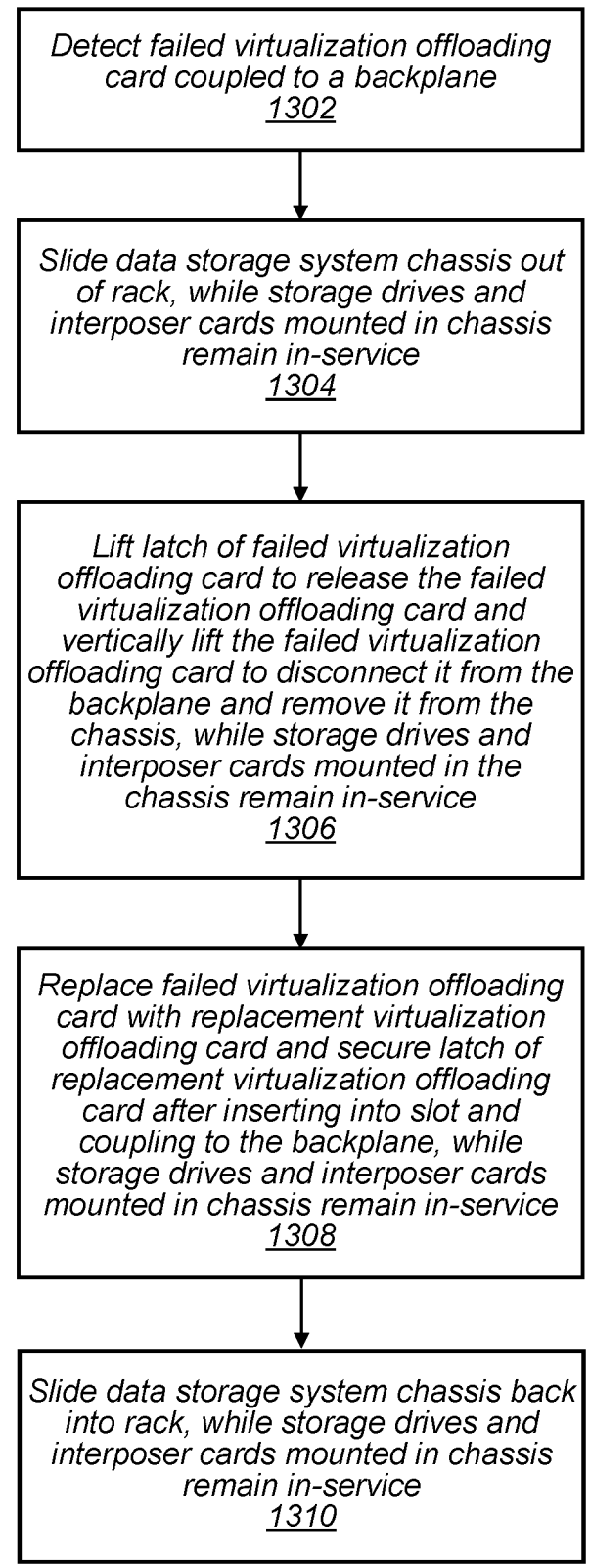
FIG. 13 is a flowchart illustrating a procedure for replacing a failed virtualization offloading card without interrupting operation of storage drives or interposer cards mounted in a chassis with the failed virtualization offloading card, according to some embodiments.

FIG. 13 is a flowchart illustrating a procedure for replacing a failed virtualization offloading card without interrupting operation of storage drives or interposer cards mounted in a chassis with the failed virtualization offloading card, according to some embodiments.

At 1302, a failed virtualization offloading card coupled to a backplane of the data storage system is detected.

At 1304, the data storage system chassis is slid out of the rack, while mass storage drives and interposer cards in the data storage system chassis remain connected to power and network and in service.

At 1306, a latch of the failed virtualization offloading card is lifted to release the failed virtualization offloading card from a retaining wall of the chassis. This may be done while the mass storage devices and interposer cards remain connected and in service. Also, the failed virtualization offloading card is lifted vertically out of the data storage system chassis.

At 1308, the failed virtualization offloading card is replaced with a replacement virtualization offloading card. The replacement virtualization offloading card is dropped vertically into a slot left by the removed failed virtualization offloading card. In some embodiments, the virtualization offloading card may be connected to an interposer card that couples with one or more backplane connectors of the backplane. Also, once installed, the latch(es) of the replacement virtualization offloading card may be lowered to secure the replacement virtualization offloading card in the chassis.

At 1310, the data storage system chassis is slid back into the rack.

Figure 14:
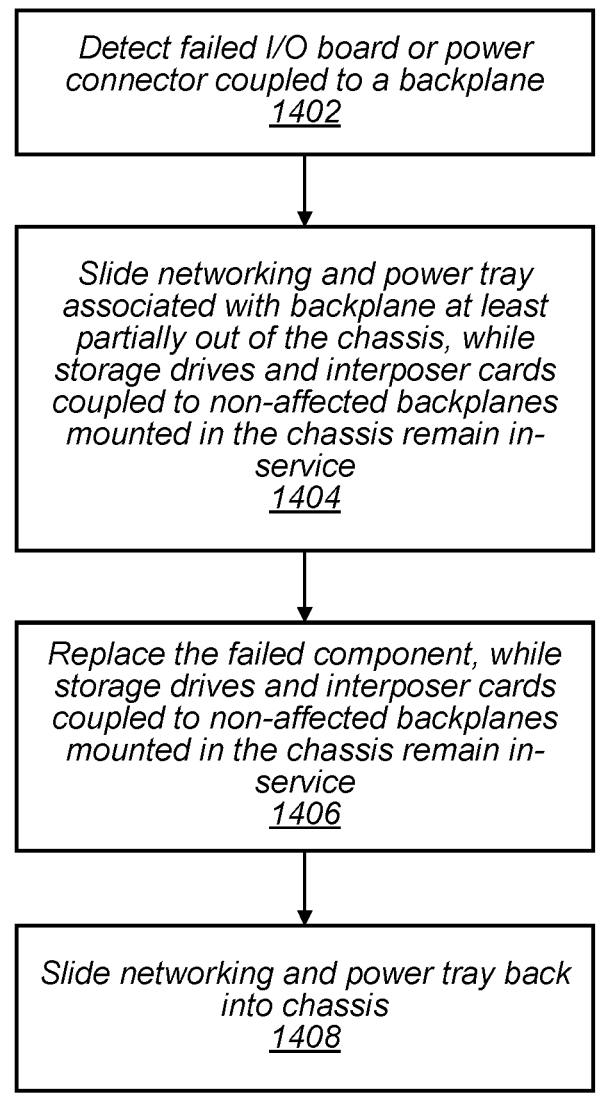
FIG. 14 is a flowchart illustrating a procedure for replacing a failed I/O board or a failed power connector for a backplane without interrupting operation of other storage drives or interposer cards mounted on other backplanes in a chassis with the backplane, according to some embodiments.

FIG. 14 is a flowchart illustrating a procedure for replacing a failed I/O board or a failed power connector for a backplane without interrupting operation of other storage drives or interposer cards mounted on other backplanes in a chassis with the backplane, according to some embodiments.

At 1402, a failed I/O board or power connector associated with one of the backplane sleds of the data storage system is detected.

At 1404, a networking and power tray corresponding to the backplane with the failed I/O board or failed power connector is slid out of the chassis. For example, one of power and networking trays 832 may be slid out of chassis 802 (as shown in FIGS. 8A-8C). This may be done while other backplane sleds and attached interposer cards and mass storage devices remain connected to power and networking and are in-service.

At 1406, the failed component is replaced and at 1408, the networking and power tray is slid back into the chassis.

Figure 15:
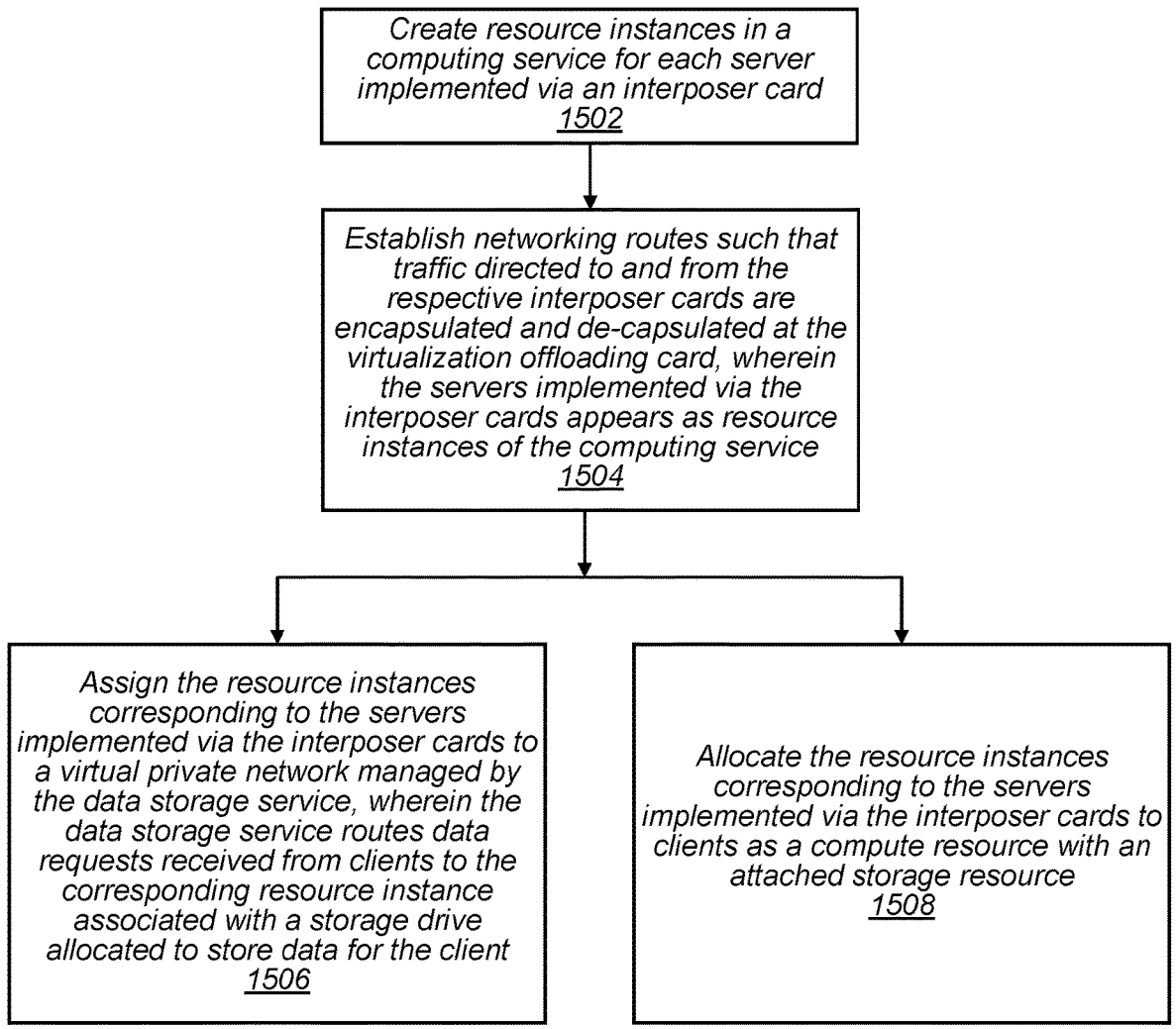
FIG. 15 is a flowchart illustrating a process of managing individual servers implemented via interposer cards of a data storage system, wherein the individual servers are managed as compute instances of a computing service, according to some embodiments.

FIG. 15 is a flowchart illustrating a process of managing individual servers implemented via interposer cards of a data storage system, wherein the individual servers are managed as compute instances of a computing service, according to some embodiments.

At 1502, resource instances are created in a computing service corresponding to servers implemented on SoCs of interposer cards of a data storage system.

At 1504, networking routes are established such that traffic directed to and from the respective interposer cards are encapsulated and de-capsulated at the virtualization offloading card, wherein the servers implemented via the interposer cards appears as resource instances of the computing service.

At 1506, the resource instances of the computing service corresponding to the servers implemented via the interposer cards may be assigned to a virtual private network managed by the data storage service, wherein the data storage service routes data requests received from clients to the corresponding resource instance associated with a storage drive allocated to store data for the client.

As another option, at 1508, the resource instances corresponding to the servers implemented via the interposer cards to clients may be allocated to clients of the compute service as compute instances with an attached storage resource.

In some embodiments, mass storage devices in a data storage system are standard, off-the-shelf hard disk drives. Examples of suitable hard disk drive form factors may include 3.5", 5.25", and 2.5". In one embodiment, a standard 3.5" hard disk drive is installed in a device slot of a plurality of device slots of an array along with other standard 3.5" hard disk drives.

Although in the embodiments described above, some of the data storage systems have been described as being 3 U, 4 U, or 5 U in height, data storage systems may in various embodiments be 2 U, 4 U, 5 U, 6 U or any other height or dimensions.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data storage system, comprising:
   a chassis:
   sleds mounted in the chassis;
   respective backplanes mounted in respective ones of the sleds;
   mass storage devices mounted in the chassis; and
   interposer cards mounted between respective ones of the mass storage devices and the respective backplanes of the respective sleds;
   wherein the interposer cards comprise:
      a connector on a first face of the interposer card configured to couple the interposer card to a corresponding connector of one of the backplanes;
      a connector on a second face of the interposer card configured to couple the interposer card to a corresponding connector of one of the mass storage devices; and
      a processor and memory configured to implement an individual server for the mass storage device connected to the interposer card;
   wherein the respective ones of the backplanes are configured to provide network connections between a network external to the chassis and the individual servers implemented for each of the mass storage devices via the respective interposer cards.

2. The data storage system of claim 1, wherein the interposer cards have a width and a length such that individual ones of the interposer cards have a card size that corresponds to a size of a bottom surface of the mass storage device to which the interposer card is connected.

3. The data storage system of claim 1, wherein in response to a failure of an interposer card or a failure of a mass storage device, remaining non-failed interposer cards and remaining non-failed mass storage devices coupled to a same backplane as the failed interposer card or the failed mass storage device are configured to continue to provide data storage services to clients of the data storage system for data stored in the remaining non-failed mass storage devices.

4. The data storage system of claim 3, wherein a blast radius of affected components of the data storage system, affected by a failure of an interposer card, is limited to the failed interposer card and an individual mass storage device coupled to the interposer card.

5. The data storage system of claim 1, wherein the chassis is configured to be mounted in a rack,
   wherein the backplane comprises:
   a network connector configured to couple via one or more cables with a rack-level networking switch of the rack;
   the connectors of the backplane configured to couple with the connectors on the second face of the interposer cards;
   a network switching circuit; and
   network traces configured to connect the network connector to the network switching circuit and to connect the network switching circuit to the connectors of the backplane configured to couple with the connectors of the interposer cards,
   wherein the network connector, the network switching circuit, the network traces, and the connectors of the backplane are configured to provide Ethernet connectivity from the rack-level networking switch to the respective interposer cards.

6. The data storage system of claim 1, further comprising:
   a virtualization offloading card coupled to at least one of the respective backplanes, wherein the virtualization offloading card is configured to:
      encapsulate traffic to and from the respective ones of interposer cards, wherein the encapsulated traffic is formatted in accordance with a format used by a computing service, and wherein the individual ones of the servers implemented at the individual interposer cards are managed as resources of the computing service; and
   a security control circuit coupled to the respective backplane, wherein the security control circuit is configured to:
      limit control access to individual interposer cards.

7. A device, comprising:
an interposer card configured to be mounted to an individual mass storage device, wherein the interposer card comprises:
- a connector located on a first side of the interposer card, wherein the connector is configured to couple with a corresponding connector of the individual mass storage device upon which the interposer card is configured to mount;
- a connector located on a second side of the interposer card, wherein the connector is configured to couple the interposer card to a corresponding connector of a backplane;
- a processor; and
- a memory storing program instructions, that when executed by the processor, cause the processor to implement an individual server for accessing or storing data on the individual mass storage device upon which the interposer card is mounted.

8. The device of claim 7, wherein the interposer card has a width and a length such that a size of the interposer card corresponds to a size of a bottom surface of the mass storage device upon which the interposer card is configured to mount.

9. The device of claim 8, wherein one of the length or the width of the interposer card is approximately four inches and the other one of the length or the width is approximately one inch.

10. The device of claim 7, wherein:
the processor is a system on a chip (SoC) mounted on a printed circuit board of the interposer card; and
the memory comprises dynamic random access memory (DRAM) and flash memory modules mounted on the printed circuit board of the interposer card.

11. The device of claim 7, wherein the connector located on the second side of the interposer card and configured to couple the interposer card to the corresponding connector of the backplane is configured to establish an Ethernet connection between the backplane and the interposer card.

12. The device of claim 7, wherein the connector located on the first side of the interposer card and configured to couple the interposer card to the mass storage device is configured to establish a serial advanced technology attachment (SATA) connection between the mass storage device and the interposer card.

13. The device of claim 7, further comprising:
a bumper plate layer coupled to the interposer card, wherein at least a portion of a perimeter of the bumper plate layer extends beyond a length or width of the interposer card, wherein the bumper plate layer is configured to prevent damage to the interposer card during installation and removal of a mass storage device to which the interposer card is mounted.

14. The device of claim 7, wherein the processor is mounted on the second face of the interposer card, and wherein the interposer card further comprises:
a heat sink mounted on the processor and extending away from the second face of the interposer card,
wherein the connector on the second face of the interposer card when coupled with the connector of the backplane at least partially supports the interposer card and an attached mass storage device such that an air passage is formed between the interposer card and the backplane, wherein the heat sink is configured such that air flowing through the air passage flows across fins of the heat sink.

* * * * *